US012745366B2

(12) United States Patent
Tanaka et al.

(10) Patent No.: US 12,745,366 B2
(45) Date of Patent: Sep. 22, 2026

(54) COOLANT FLOW PATH-ATTACHED CONDUCTIVE MEMBER

(71) Applicant: Yazaki Corporation, Tokyo (JP)

(72) Inventors: Hiroyuki Tanaka, Kakegawa (JP); Kazuki Shirosaka, Kakegawa (JP); Junya Higashi, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 265 days.

(21) Appl. No.: 18/806,013

(22) Filed: Aug. 15, 2024

(65) Prior Publication Data

US 2025/0098111 A1 Mar. 20, 2025

(30) Foreign Application Priority Data

Sep. 20, 2023 (JP) ................................ 2023-152094

(51) Int. Cl.
*H05K 7/20* (2006.01)
*H01B 7/00* (2006.01)
*H01B 7/42* (2006.01)

(52) U.S. Cl.
CPC ....... *H05K 7/20272* (2013.01); *H01B 7/0027* (2013.01); *H01B 7/42* (2013.01)

(58) Field of Classification Search
CPC .. H05K 7/20272; H05K 7/20; H05K 7/20009; H05K 7/20218; H05K 7/20209; H05K 7/20636; H05K 7/20927; H01B 7/0027; H01B 7/42; H01B 7/421; H01B 7/423; H01H 2009/523; H01H 50/12
USPC ......... 174/9 F, 15.1, 547; 361/676, 677, 728
See application file for complete search history.

(56) References Cited

U.S. PATENT DOCUMENTS

| | | | | |
|---|---|---|---|---|
| 5,768,103 | A * | 6/1998 | Kobrinetz | F28F 13/02 174/15.1 |
| 7,508,676 | B1 * | 3/2009 | Samaniego | F28F 9/0246 361/728 |
| 11,917,799 | B2 * | 2/2024 | Zwijze | H01M 10/6556 |
| 12,356,588 | B2 * | 7/2025 | Liu | H05K 7/20781 |

FOREIGN PATENT DOCUMENTS

| | | |
|---|---|---|
| JP | 2018-018661 A | 2/2018 |

* cited by examiner

*Primary Examiner* — Angel R Estrada
(74) *Attorney, Agent, or Firm* — Sughrue Mion, PLLC

(57) ABSTRACT

A coolant flow path-attached conductive member includes a first component that has one of divided shapes obtained by dividing a band plate member having an internal flow path that allows a coolant to pass at least in a length direction thereof, the first component being made of a conductive metal, one end side of the first component being connected to a component terminal of a predetermined electric/electronic component, the other end side being connected to an electrical connection target of the electric/electronic component, a second component that has the other of the divided shapes and that is combined with the first component to constitute the band plate member, and a pair of coolant ports provided on the band plate member to allow the coolant to flow through the internal flow path of the band plate member constituted by combining the first component and the second component.

15 Claims, 22 Drawing Sheets

COOLANT FLOW PATH-ATTACHED CONDUCTIVE MEMBER

TECHNICAL FIELD

The present disclosure relates to a coolant flow path-attached conductive member that connects a component terminal of an electric/electronic component to an electrical connection target while cooling the coolant flow path-attached conductive member itself.

BACKGROUND

For example, Patent Document 1 discloses a conventional coolant flow path-attached conductive member that is a conductive member that connects a component terminal of an electric/electronic component to an electrical connection target and that additionally includes a cooling function for cooling the coolant flow path-attached conductive member itself. The coolant flow path-attached conductive member of Patent Document 1 has a configuration in which both ends of a conductive pipe are crushed to form a component terminal of an electric/electronic component and a connection portion with an electrical connection target. The electrical connections are made through the conductive pipe itself, and cooling is provided by a coolant that is passed through the pipe.

RELATED ART

Patent Documents

[Patent Document 1] JP2018018661 (A)

SUMMARY OF THE INVENTION

Problem to Be Solved by the Invention

Here, the above-mentioned coolant flow path-attached conductive member using a conductive pipe is disadvantageous in terms of reducing the height because its thickness is determined by the diameter of the pipe. Also, if the current flowing during energization increases, the diameter of the pipe must be increased, making it even more difficult to reduce the height.

Accordingly, the present disclosure has been made in view of the problems explained above, and it is an object of the present disclosure to provide a coolant flow path-attached conductive member that can achieve both a low height and a large current during energization.

Solution to Problem

In order to solve the problems explained above, a coolant flow path-attached conductive member includes a first component that has one of divided shapes that are obtained by dividing, into two in a thickness direction, a band plate member including an internal flow path, the band plate member being in a shape of a flat band plate in which a thickness size is shorter than a width size and having the internal flow path that allows a coolant to pass at least in a length direction thereof, the first component being made of a conductive metal, one end side of the first component being connected to a component terminal of a predetermined electric/electronic component, the other end side being connected to and in electrical connection with an electrical connection target of the electric/electronic component, a second component that has the other of the divided shapes and that is combined with the first component to constitute the band plate member, and a pair of coolant ports provided on the band plate member to allow the coolant to flow through the internal flow path of the band plate member constituted by combining the first component and the second component.

Advantageous Effects of the Invention

According to the coolant flow path-attached conductive member explained above, both a low height and a large current during energization can be achieved.

BRIEF DESCRIPTION OF THE DRAWINGS

FIG. 13 is a plan view of the coolant flow path-attached conductive member illustrated in FIG. 11, excluding the electric/electronic component, as viewed from the direction of arrow V41 of FIG. 11.

FIG. 19 is a top view of a single band plate member illustrated in FIG. 17, illustrating an internal flow path and an electric/electronic component as viewed from the direction of arrow V52 of FIG. 17.

FIG. 22 is a perspective view illustrating a coolant flow path-attached conductive member according to a seventh embodiment.

DETAILED DESCRIPTION OF THE EXEMPLARY EMBODIMENT

Hereinafter, one embodiment of a coolant flow path-attached conductive member 1 is explained. First, a first embodiment is explained.

Figure 1:
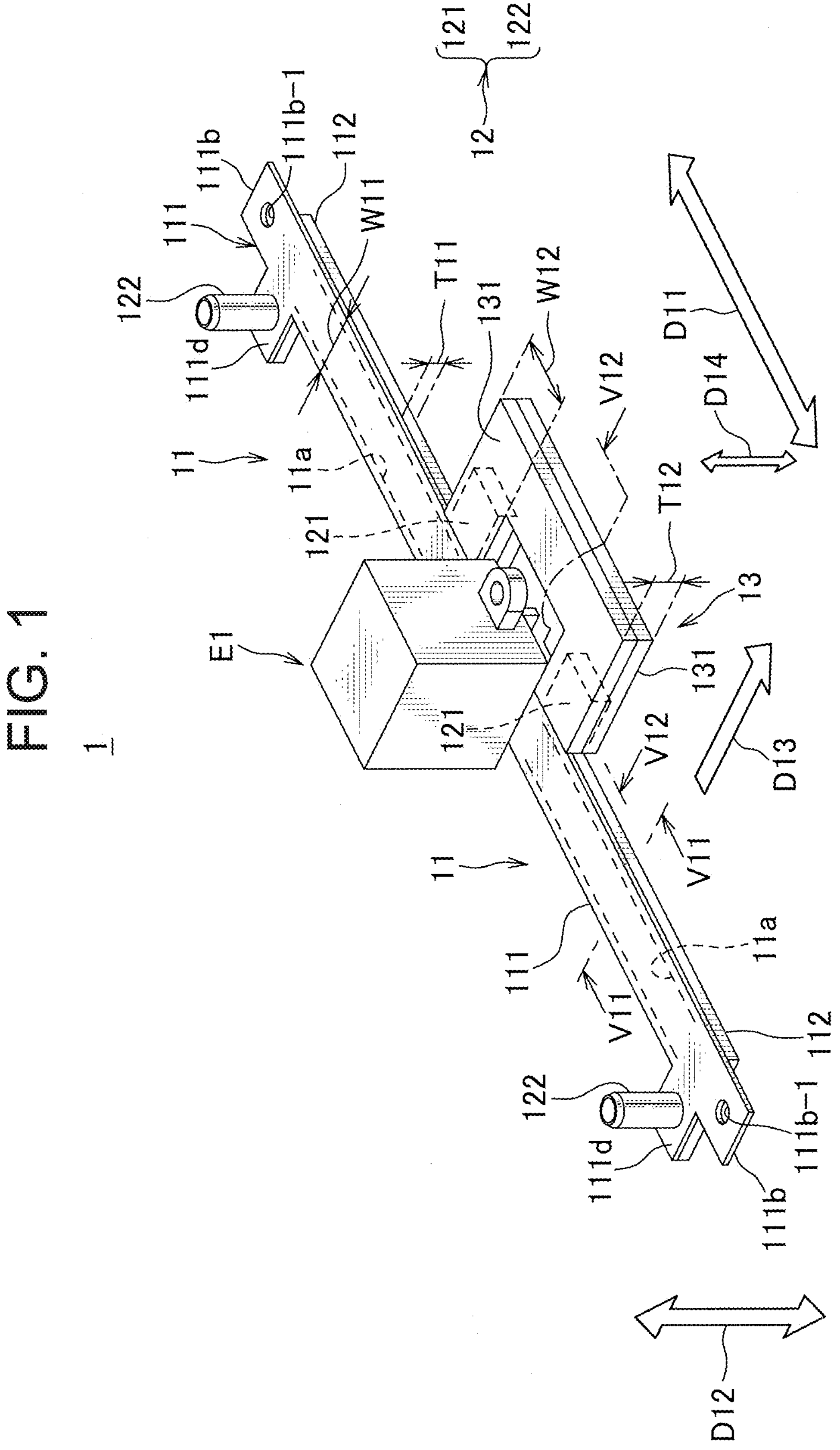
FIG. 1 is a perspective view illustrating a coolant flow path-attached conductive member according to a first embodiment.
Figure 2:
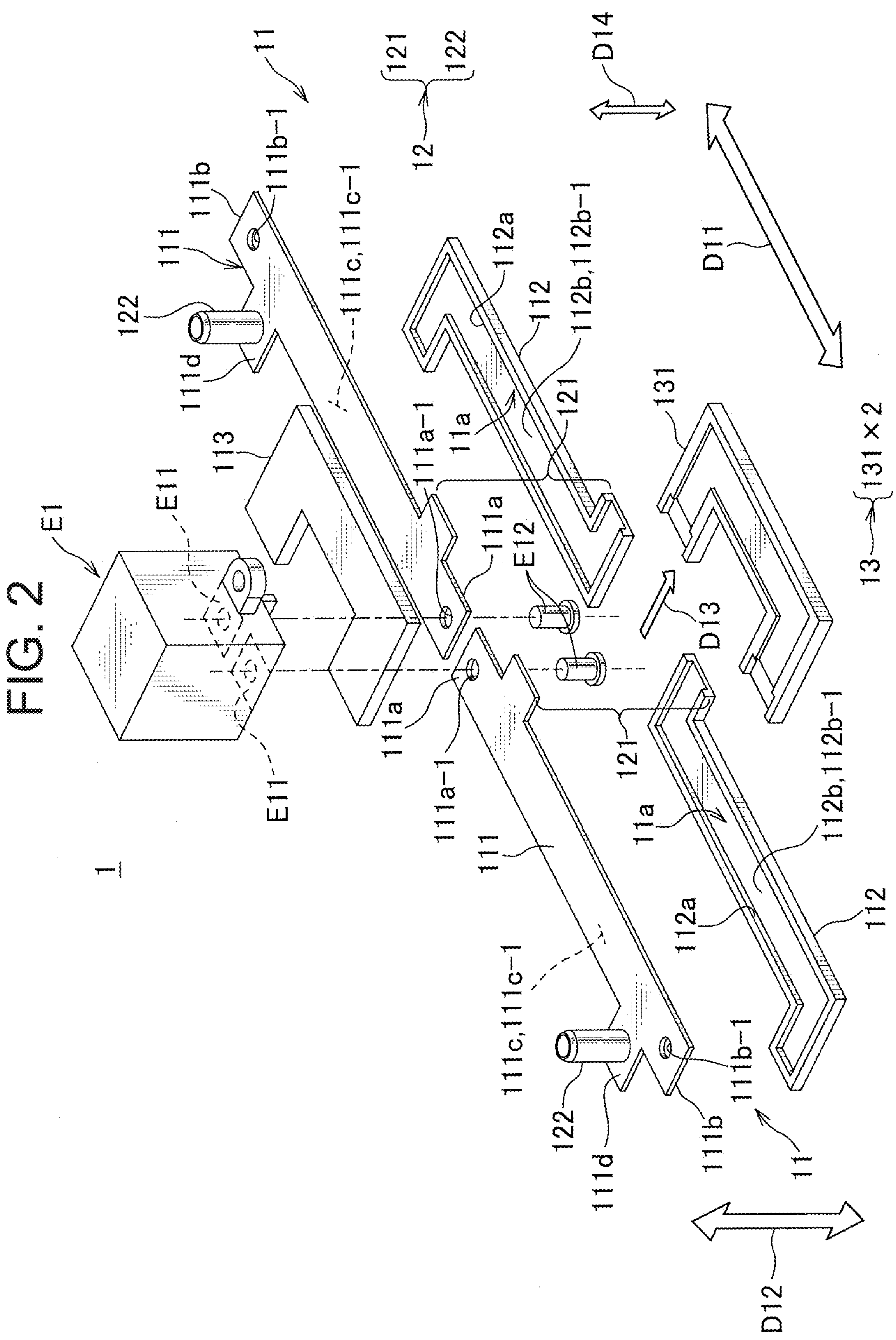
FIG. 2 is an exploded perspective view of the coolant flow path-attached conductive member illustrated in FIG. 1.
Figure 3:
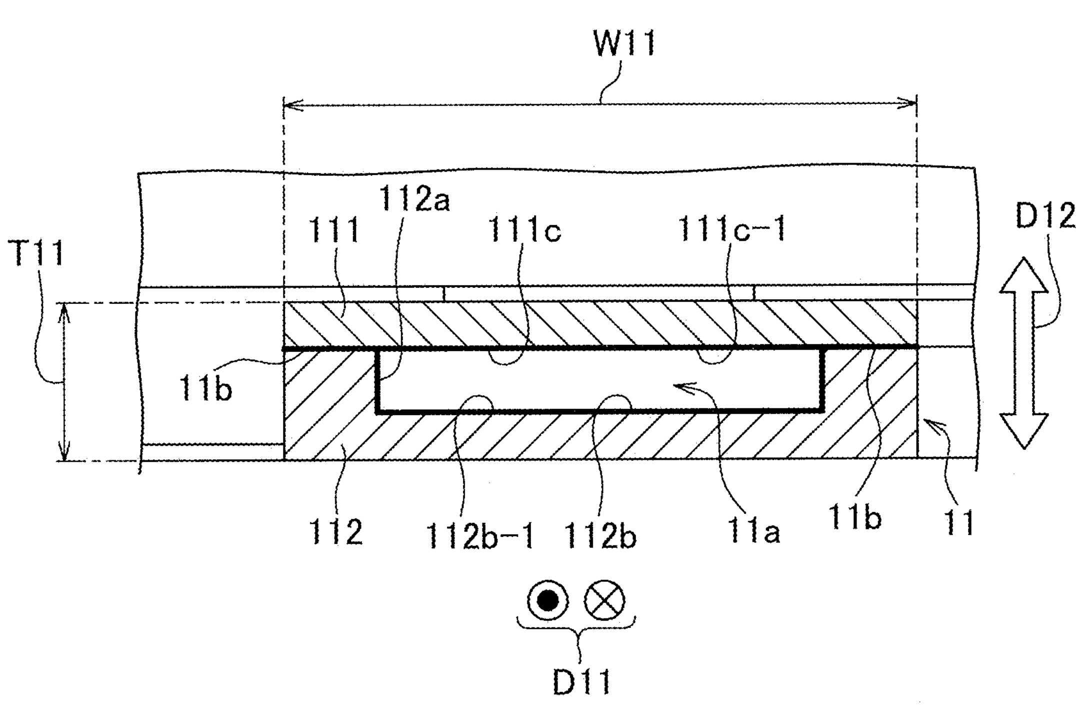
FIG. 3 is a cross-sectional view taken along line V11-V11 of FIG. 1.
Figure 4:
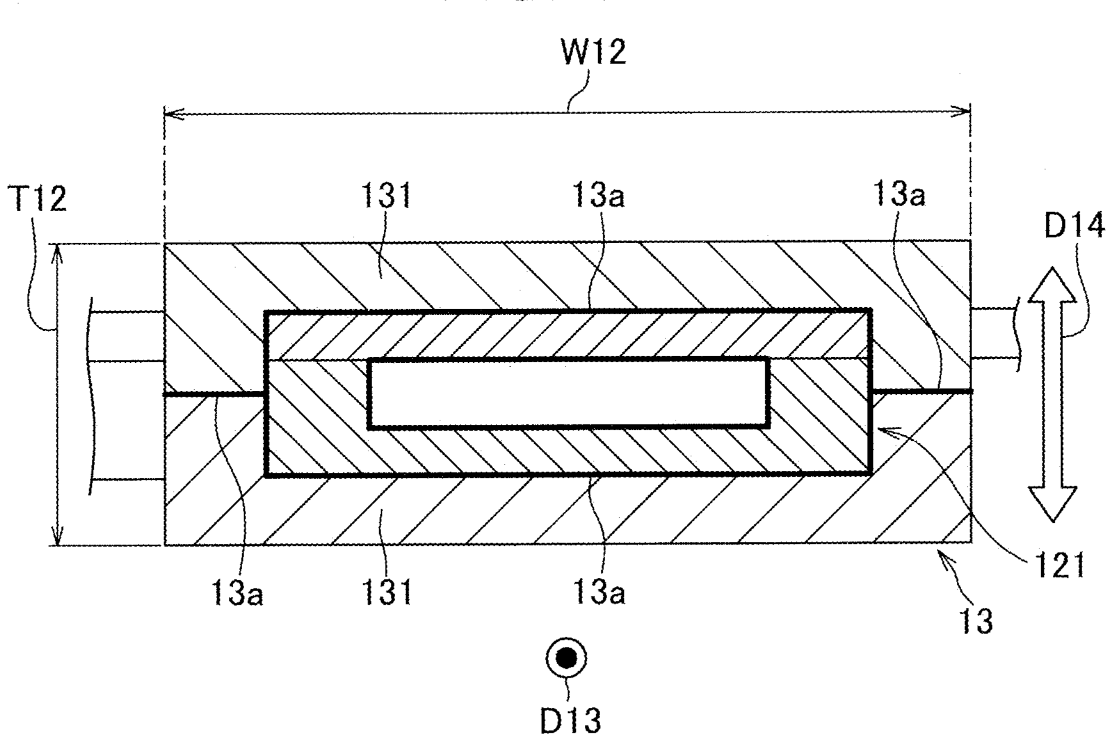
FIG. 4 is a cross-sectional view taken along line V12-V12 of FIG. 1.

FIG. 1 is a perspective view illustrating the coolant flow path-attached conductive member 1 according to a first embodiment. FIG. 2 is an exploded perspective view of the coolant flow path-attached conductive member 1 illustrated in FIG. 1. FIG. 3 is a cross-sectional view taken along line V11-V11 of FIG. 1. FIG. 4 is a cross-sectional view taken along line V12-V12 of FIG. 1.

The coolant flow path-attached conductive member 1 according to the present embodiment is a member for connecting each of a pair of component terminals E11 of a relay, i.e., an electric/electronic component E1, to an electrical connection target of the electric/electronic component E1. This coolant flow path-attached conductive member 1 includes a pair of band plate members 11 connected, in one-to-one correspondence, to the pair of component terminals E11, two pairs of coolant port 12, each pair being provided for each band plate members 11, and a flat connection pipe 13 connecting the pair of band plate members 11.

Each of the pair of band plate members 11 is in a shape of a flat band plate in which a thickness size T11 is shorter than a width size W11 and is a member including an internal flow path 11*a* allowing coolant to pass in a length direction D11 of the internal flow path 11*a*. Each of the pair of band plate members 11 includes a first component 111 and a second component 112.

The first component 111 is a member that has one of the shapes obtained by dividing, in the thickness direction D12 into two, the band plate member 11 including the internal flow path 11*a*. In the present embodiment, the first component 111 is a cover component that covers a groove opening 112*a* of the second component 112, serving as a groove component, extending along the internal flow path 11*a* to constitute the internal flow path 11*a*. The first component 111 is made of a conductive metal, one end of the first component 111 being a component-side connection piece 111*a* connected to the component terminal E11 of the predetermined electric/electronic component E1, the other end of the first component 111 being a target-side connection piece 111*b* connected to the electrical connection target. The first component 111 serves as a busbar connecting the component terminal E11 of the electric/electronic component E1 and the electrical connection target.

The second component 112 is a member that has the other of the shapes obtained by dividing the band plate member 11 into two. In the present embodiment, the second component 112 is a groove component of which the groove opening 112*a* is covered with the first component 111 serving as the cover component. The second component 112 is combined with the first component 111 to constitute the band plate member 11. The second component 112 is a flat rectangular groove component of which the groove cross section is a flat rectangular shape. When the groove opening 112*a* of the second component 112 is covered with the first component 111, the band plate member 11 in the flat rectangular tube shape with the internal flow path 11*a* with a flat rectangular flow path cross section is formed. In the present embodiment, similar to the first component 111, the second component 112 is also made of a conductive metal.

In this case, the component-side connection piece 111*a* and the target-side connection piece 111*b* of the first component 111 are rectangular pieces that extend in the length direction D11 of the band plate member 11 beyond the second component 112 and that are connected to the component terminal E11 and the electrical connection target, respectively. The component-side connection piece 111*a* is fastened and fixed to the component terminal E11 via a screw E12, and a through hole 111*a*-1 for the screw E12 is provided substantially in the center of the component-side connection piece 111*a*. The target-side connection piece 111*b* is similar thereto and has a similar through hole 111*b*-1 provided substantially in the center.

In the present embodiment, water, which is a conductive fluid, is used as the coolant flowing through the internal flow path 11*a*. On both the first component 111 and the second component 112, insulating coatings 111*c*-1, 112*b*-1 are formed on surface portions 111*c*, 112*b* that form the inner surface of the internal flow path 11*a* as an insulating treatment to electrically insulate the coolant from the first component 111 and the second component 112. The first component 111 and the second component 112 are joined together by forming a watertight joint portion 11*b* to prevent the coolant from leaking from the internal flow path 11*a*. The watertight joint portion 11*b* is formed by joining with an adhesive having watertight performance, or by brazing or welding the first component 111 and the second component 112 as metal members.

Next, the pair of coolant ports 12 provided on each of the band plate members 11 is a portion provided to allow the coolant to flow into the internal flow path 11*a*. A component-side port 121 is provided near the component-side connection piece 111*a* of the first component 111, and a connection-side port 122 is provided near the target-side connection piece 111*b*.

The component-side port 121 is a flow path opening that is open in an extension direction of an internal flow path 11*a* at an end of the band plate member 11 on a side of the component-side connection piece 111*a*, i.e., at a position adjacent to one end side of the first component 111. In this case, the internal flow path 11*a* bends at a substantially right angle to the length direction D11 at the position adjacent to the one end side, and the component-side port 121 is a flow path opening that opens in the right-angle extension direction D13 thus bent. The component-side connection piece 111*a* is a rectangular piece in which a part of the first component 111 projects in the length direction D11 from the edge of the second component 112 that constitutes the component-side port 121.

In contrast, the connection-side port 122 is a portion vertically provided on an external surface 111*d* of the first component 111 that is one of the front and back surfaces of the band plate member 11 at an end of the band plate member 11 on the side of the target-side connection piece 111*b*, i.e., at a position adjacent to the other end side of the first component 111. At the position adjacent to the other end side, the internal flow path 11*a* bends at a substantially right angle to the length direction D11 in the opposite direction to the right angle extension direction D13 of the component-side port 121 explained above. The connection-side port 122 is a tube-shaped protrusion that is vertically provided on the external surface 111*d* of the extension portion of the first component 111 and that is connected to the internal flow path 11*a*. The target-side connection piece 111*b* is a rectangular piece in which a part of the first component 111 projects in the length direction D11 from the right-angled extension portion of the second component 112 covered with the extension portion on which the connection-side port 122 is vertically provided.

The flat connection pipe 13 connects the component-side ports 121 of the pair of band plate members 11 to each other, thereby connecting the pair of internal flow paths 11*a*. Similar to the band plate member 11, the flat connection pipe 13 also has a flat shape in which a pipe thickness size T12 is shorter than a pipe width size W12. However, the flat connection pipe 13 is formed of an insulating material so as not to electrically short-circuit the pair of band plate members 11. In the present embodiment, the flat connection pipe 13 is a pipe in a U shape that is connected to one of the component-side ports 121, extends in the right angle extension direction D13, bends at a right angle twice along the way, extends in the right angle extension direction D13, and is connected to the other of the component-side ports 121. Similar to the band plate member 11, the flat connection pipe 13 is the pipe in the flat rectangular tube shape with a flat rectangular flow path cross section, and the flat connection pipe 13 is constituted by a pair of flat groove members 131 obtained by dividing, in the thickness direction D14 into two, the pipe in the flat rectangular tube shape. The flat connection pipe 13 is connected to the respective component-side ports 121 such that the component-side ports 121 are sandwiched in the thickness direction D14 at both ends of the pair of flat groove members 131. The connection here is made to form a watertight joint portion 13*a* to prevent the coolant from leaking from the connection portions with the component-side ports 121. The watertight joint portion 13*a* may be a joint portion between the pair of flat groove members 131, including the component-side ports 121, which is formed using an adhesive having watertight performance. Another example of the watertight joint portion 13*a* includes a welded portion that joins the pair of flat groove members 131, including the component-side ports 121, together by partially heating and melting the flat groove members 131 made of resin.

According to the coolant flow path-attached conductive member 1 according to the first embodiment explained above, the current can be increased by expanding only the width size of the first component 111 having a current-carrying function, i.e., the width size W11 of the band plate member 11. On the other hand, the thickness size T11 of the band plate member 11 does not change and is shorter than the width size W11, so that the height of the coolant flow path-attached conductive member 1 can be made into low profile. Therefore, according to the coolant flow path-attached conductive member 1 according to the present embodiment, both a low profile and a large current during energization can be achieved.

In this case, in the present embodiment, the second component 112 is a groove component, and the first component 111 is a cover component. With this configuration, the combination of the groove component and the cover component can effectively form the internal flow path 11*a* in the flat tube shape.

In the present embodiment, one end side of the first component 111 is the component-side connection piece 111*a* projecting from the second component 112, and the other end side is the target-side connection piece 111*b* extending from the second component 112. According to this configuration, the component-side connection piece 111*a* and the target-side connection piece 111*b*, which are electrical connection portions and generate more heat during energization than other portions, are made into a projecting shape, so that the internal flow path 11*a* can be formed in the vicinity of these portions. In other words, according to the above configuration, the component-side connection piece 111*a* and the target-side connection piece 111*b*, which are expected to generate a lot of heat during energization, can be efficiently cooled.

In addition, the component-side ports 121 of the pair of coolant ports 12 are the flow path openings that are open in the right angle extension direction D13 of the internal flow paths 11*a*. In contrast, the connection-side ports 122 of the pair of coolant ports 12 are the tube shape protrusions that are vertically provided on one of the front and back surfaces of the band plate members 11 and that are connected to the internal flow paths 11*a*. According to this configuration, one of the pair of coolant ports 12 is the flow path opening of the internal flow path 11*a* in the flat shape, so that the internal flow path 11*a* can be readily connected to other flow paths having similar flat shapes. In contrast, the other of the pair of coolant ports 12 is the tube shape protrusion connected to the internal flow path 11*a*, so that it can be connected to flow paths of other shapes, such as pipe shapes, which improves the degree of flexibility in terms of flow path connections.

Furthermore, in the present embodiment, the pair of band plate members 11 are provided to be connected, in one-to-one correspondence, to the pair of component terminals E11 of the electric/electronic component E1, and the internal flow paths 11*a* of the pair of band plate members 11 are connected by the flat connection pipe 13 made of the insulating material. According to this configuration, the pair of band plate members 11 connected to the electric/electronic component E1 can be efficiently cooled by the single coolant flow path formed by connecting the pair of internal flow paths 11*a* via the flat connection pipe 13. Furthermore, since the internal flow paths 11*a* are connected via the flat connection pipe 13, the coolant flow path-attached conductive member including the flat connection pipe 13 can be made into low profile.

In the present embodiment, in both the first component 111 and the second component 112 of each of the band plate members 11, the surface portions 111*c*, 112*b* constituting the inner surface of the internal flow path 11*a* are treated with insulating treatment. According to this configuration, water, which is a common conductive coolant, can be used while effectively preventing a short circuit between the pair of component terminals E11 of the electric/electronic component E1.

Next, a second embodiment will be explained. The second embodiment differs from the first embodiment in the dividing configuration of the band plate member. Hereinafter, the second embodiment is explained focusing on the difference from the first embodiment.

Figure 5:
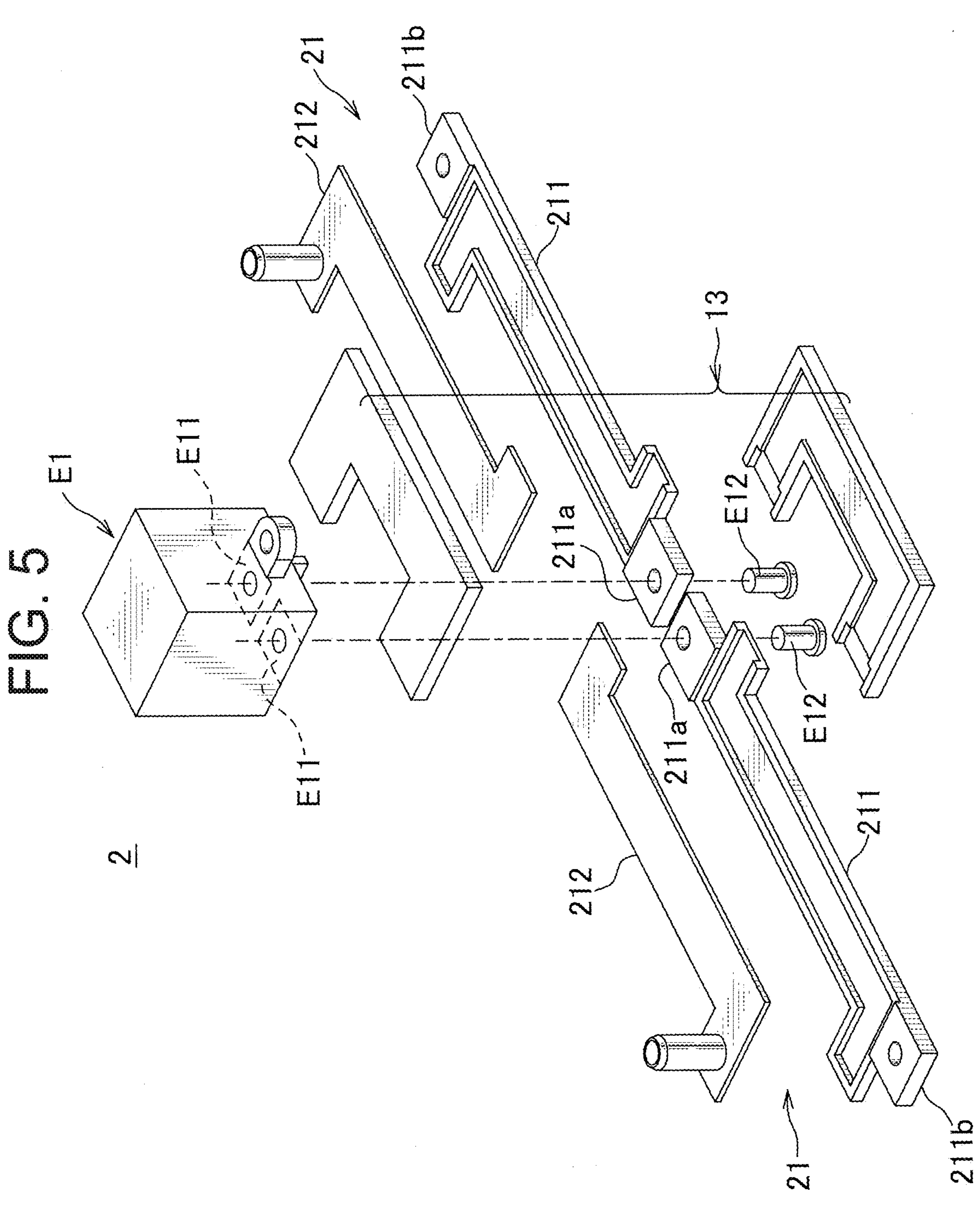
FIG. 5 is an exploded perspective view illustrating a coolant flow path-attached conductive member according to a second embodiment.

FIG. 5 is an exploded perspective view illustrating a coolant flow path-attached conductive member according to the second embodiment. In FIG. 5, constituent elements equivalent to those of the first embodiment illustrated in the exploded perspective view of FIG. 2 are denoted with the same reference numerals as those in FIG. 2 only when they necessary for explanation, and duplicate explanations about those constituent elements are below.

In the coolant flow path-attached conductive member 2 according to the second embodiment, of the first component 211 and the second component 212 constituting the band plate member 21, the first component 211 is a groove member and the second component 212 is a cover member, contrary to the first embodiment explained above. The first component 211 serving as the groove component is provided with a component-side connection piece 211*a* connected to the component terminal E11 of the electric/electronic component E1 with a screw E12 and a target-side connection piece 211*b* connected to the electrical connection target. On the other hand, the second component 212 serving the cover component in the present embodiment has a cover shape without the component-side connection piece 111*a* and the target-side connection piece 111*b* as compared with the first component 111 in the above-described first embodiment. In the present embodiment, the coolant flow path-attached conductive member 2 is constituted by connecting the pair of band plate members 21 including the first component 211 and the second component 212 with the flat connection pipe 13 equivalent to the first embodiment.

It is to be understood that according to the coolant flow path-attached conductive member 2 of the second embodiment explained above, both a low profile and a large current during energization can be achieved, similar to the first embodiment explained above.

Next, a third embodiment is explained. The third embodiment differs from the first embodiment in that the third embodiment includes a configuration to directly cool the electric/electronic component. Hereinafter, the third embodiment is explained focusing on the difference from the first embodiment.

Figure 6:
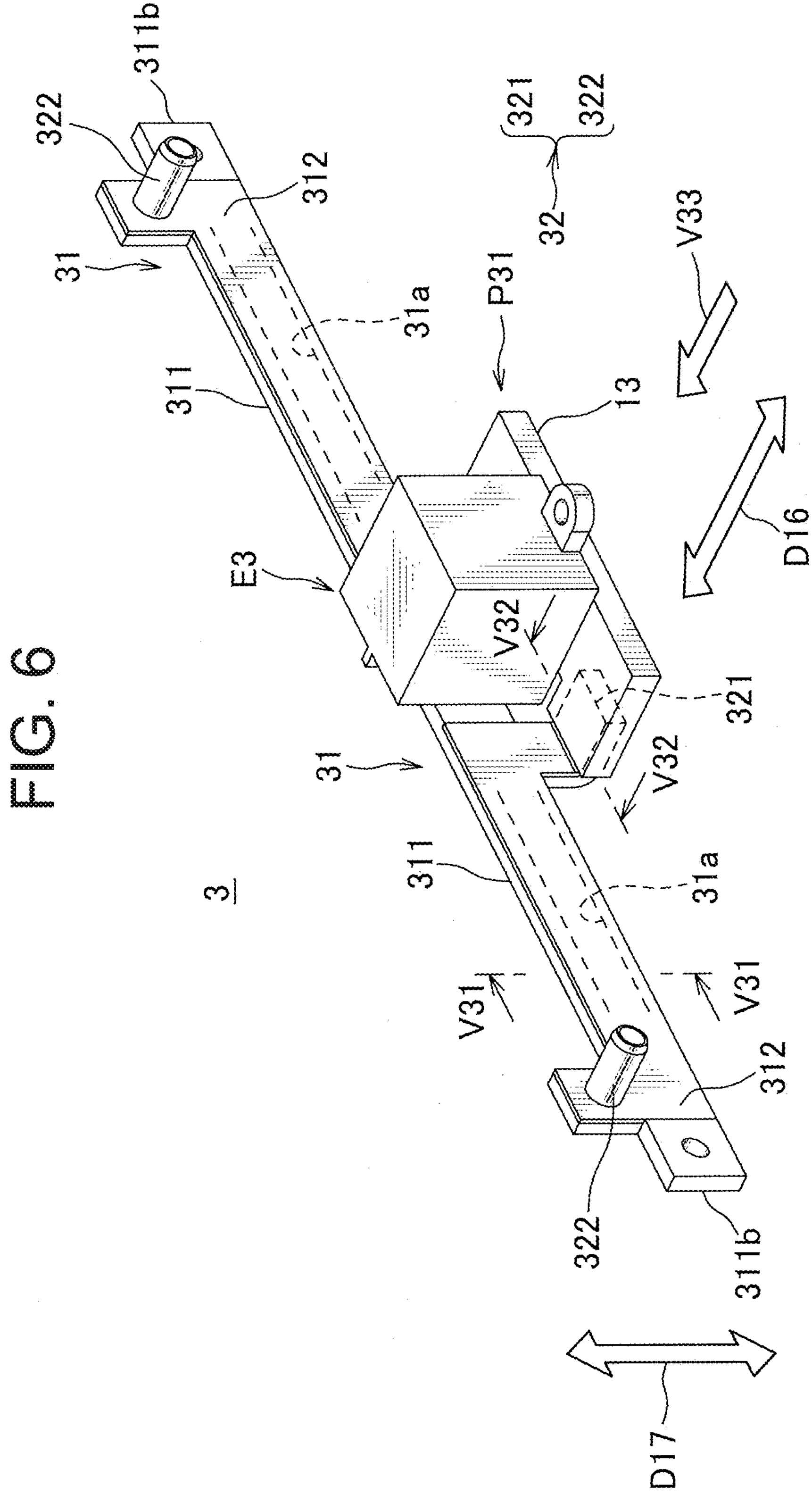
FIG. 6 is a perspective view illustrating a coolant flow path-attached conductive member according to a third embodiment.
Figure 7:
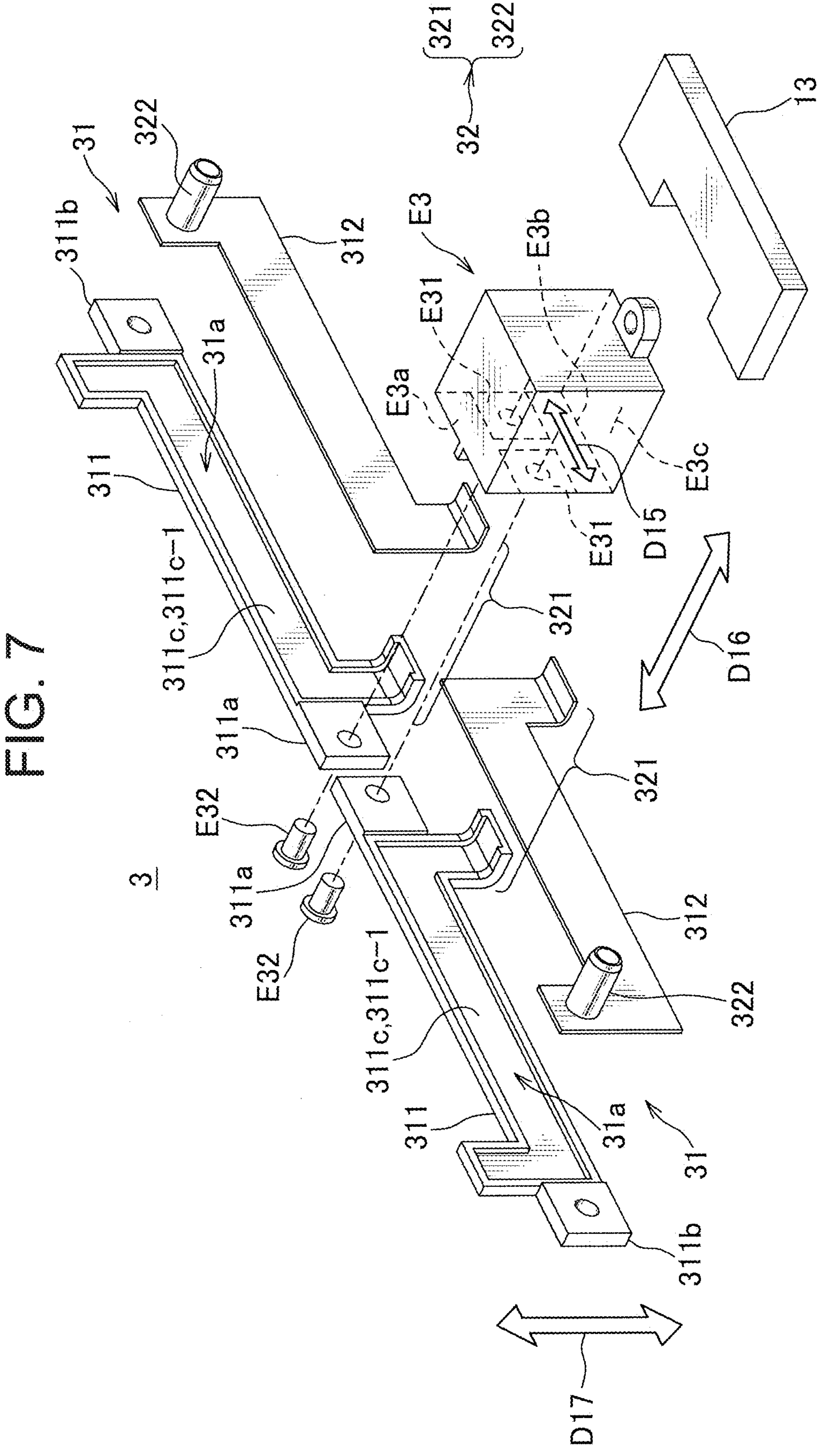
FIG. 7 is an exploded perspective view of the coolant flow path-attached conductive member illustrated in FIG. 6.
Figure 8:
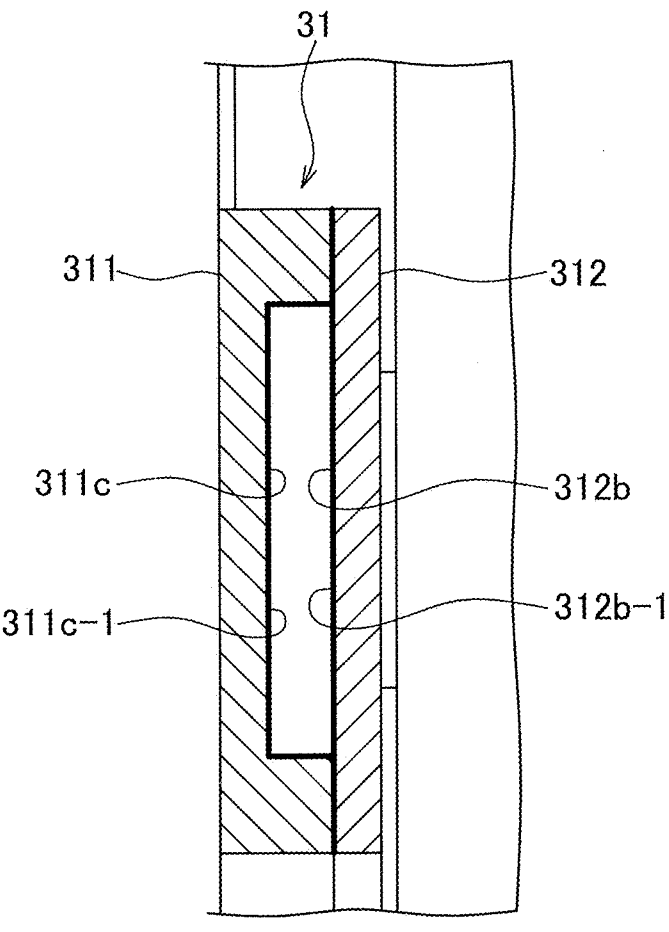
FIG. 8 is a cross-sectional view taken along line V31-V31 of FIG. 1.
Figures 9, 10:
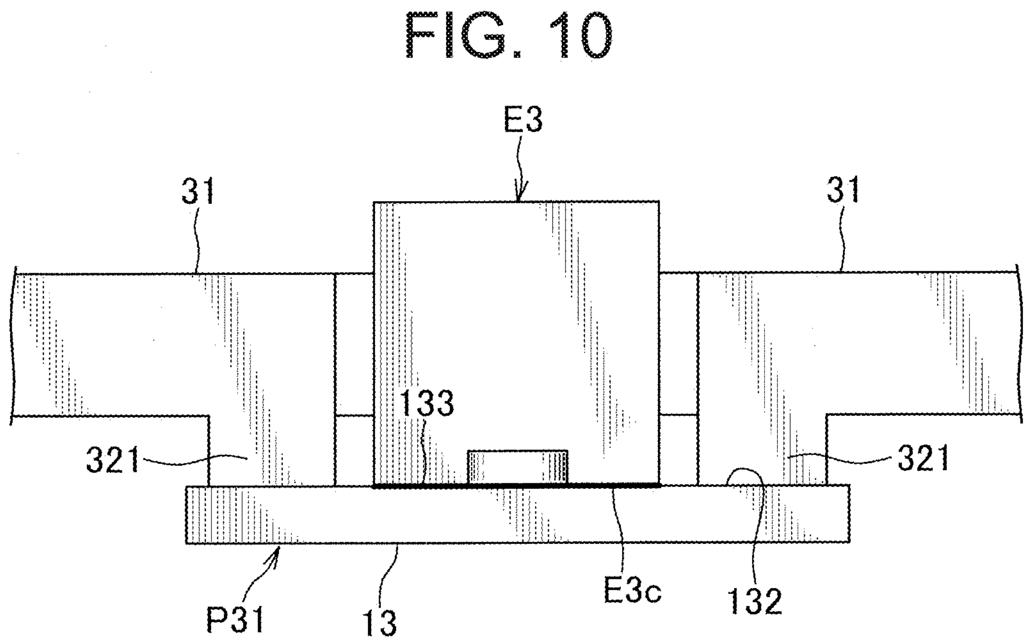
FIG. 9 is a cross-sectional view taken along line V32-V32 of FIG. 1.
FIG. 10 is a partial plan view of a peripheral structure of an electric/electronic component in the coolant flow path-attached conductive member illustrated in FIG. 6, as viewed from the direction of arrow V33 in FIG. 6.

FIG. 6 is a perspective view illustrating a coolant flow path-attached conductive member 3 according to the third embodiment. FIG. 7 is an exploded perspective view of the coolant flow path-attached conductive member 3 illustrated in FIG. 6. FIG. 8 is a cross-sectional view taken along line V31-V31 of FIG. 1. FIG. 9 is a cross-sectional view taken along line V32-V32 of FIG. 1. FIG. 10 is a partial plan view of a peripheral structure of an electric/electronic component in the coolant flow path-attached conductive member 3 illustrated in FIG. 6, as viewed from the direction of arrow V33 in FIG. 6. In FIGS. 6 to 10, constituent elements equivalent to those of the first embodiment illustrated in FIGS. 1 to 4 are denoted with the same reference numerals as those in FIGS. 1 to 4 only when they necessary for explanation, and duplicate explanations about those constituent elements are below.

First, similar to the second embodiment explained above, the coolant flow path-attached conductive member 3 according to the third embodiment includes a component-side connection piece 311*a* and a target-side connection piece 311*b* provided on a first component 311 serving as the groove component. The component-side connection piece 311*a* is connected to a component terminal E31 of an electric/electronic component E3 with a screw E32, and the target-side connection piece 311*b* is connected to an electrical connection target of the electric/electronic component E3. On the other hand, a second component 312 is simply a cover member, similar to the second embodiment. On the first component 311 and the second component 312, surface portions 311*c*, 312*b* constituting the inner surface of the internal flow path 31*a* are treated with insulating treatment for forming insulating coatings 311*c*-1, 312*b*-1 similar to the first embodiment as illustrated in FIG. 8. For the joint between the first component 311 and the second component 312, watertight joint similar to the first embodiment is made.

Here, in the present embodiment, the component terminals E31 of the electric/electronic component E3 are provided on a terminal surface E3*a* different from that in the first embodiment explained above. Similar to the first embodiment, the electric/electronic component E3 is in a shape of a rectangular block, and the pair of component terminals E31 are arranged in a terminal arrangement direction D15 along one side edge E3*b* on the terminal surface E3*a*, which is a rectangular external surface of the six surfaces of the rectangular block. However, the terminal surface E3*a* is a surface 90 degrees offset from one of the surfaces of the electric/electronic component E3 that is provided with the component terminals E31 in the first embodiment. As a result, in the present embodiment, the pair of band plate members 31 are connected to the electric/electronic component E3 in an orientation 90 degrees offset from the first embodiment. The respective component-side connection pieces 311*a* of the first components 311 of the pair of band plate members 31 are connected to the component terminals E31 so as to extend along the terminal arrangement direction D15 on the terminal surface E3*a*.

In the present embodiment, of the pair of coolant ports 32 of each of the band plate members 31, a connection-side port 322 is the same as the first embodiment except for the band plate member 31. On the other hand, the component-side port 321 connected to the flat connection pipe 13 is a bent flow path opening as follows. Specifically, the component-side port 321 is the bent flow path opening that bends and extends in an orthogonal direction D16 orthogonal to the front and back surfaces of the band plate member 31 and that is open as an extension portion of the internal flow path 31*a*. In order to constitute the bent flow path opening, an adjacent portion of the component-side connection piece 311*a* of the first component 311 is a bent groove that extends in a width direction D17 of the band plate member 31 and that bends and extends in the orthogonal direction D16 at the end side. A portion of the second component 312, serving as the cover component, that covers the bent groove is also a bent cover in a shape corresponding to the bent groove. The bent groove of the first component 311 is covered with the bent cover of the second component 312, thereby forming the component-side port 321 serving as the bent flow path opening explained above. The pair of internal flow paths 31*a* are connected by connecting the component-side ports 321 of the pair of band plate members 31 with a flat connection pipe 13 similar to that of the first embodiment. The connection of the flat connection pipe 13 to the component-side ports 321 serving as the bent flow path openings is achieved by clamping with the pair of flat groove members 131 and forming a watertight joint portion 13*a*, as illustrated in FIG. 9, similar to the first embodiment.

The flat connection pipe 13 connects the component-side ports 321, serving as the bent flow path openings, to be situated on a surface contact position P31 for an adjacent external surface E3*c* that is adjacent to the terminal surface E3*a* of the electric/electronic component E31 in a continuous manner across the one side edge E3*b* along the terminal arrangement direction D15. In the present embodiment, a surface 132 that is one of the front and back surfaces of the flat connection pipe 13 situated on the surface contact position P31 is in surface contract with the adjacent external surface E3*c*. Furthermore, the surface contact in this case is made via a heat transfer material 133 such as silicone grease, as illustrated in FIG. 10.

Similar to the first embodiment explained above, the coolant flow path-attached conductive member 3 according to the third embodiment explained above can achieve both a low height and a large current during energization.

Furthermore, in the present embodiment, the surface 132 that is one of the front and back surfaces of the flat connection pipe 13 is arranged to be in surface contact with the external surface of the electric/electronic component E31. According to this configuration, even if the electric/electronic component E3 itself generates heat, the heat can be effectively transferred to the internal coolant via the flat connection pipe 13 that is in surface contact with the external surface of the electric/electronic component E3, so that the electric/electronic component E3 can be cooled.

Furthermore, in the present embodiment, the surface contact of the flat connection pipe 13 with the electric/electronic component E3 is made via the predetermined heat transfer material 133. According to this configuration, the heat of the electric/electronic component E3 can be more effectively transferred to the flat connection pipe 13 via the heat transfer material 133.

In the present embodiment, the component terminals E31 are arranged in the terminal arrangement direction D15 on the terminal surface E3*a*, which is the rectangular external surface of the electric/electronic component E3 in the rectangular block-shape. The flat connection pipe 13 is in surface contact with the adjacent external surface E3*c* adjacent to the terminal surface E3*a*. In addition, the pair of component-side ports 321 connected by the flat connection pipe 13 each serves as the bent flow path opening that positions the flat connection pipe 13 at the surface contact position P31 for the adjacent external surface E3*c*. According to this configuration, by bringing the adjacent external surface E3*c*, adjacent to the terminal surface E3*a*, of the electric/electronic component E3 into surface contact with the flat connection pipe 13, the entirety can be made compact while the heat of the electric/electronic component E3 can be transferred to the flat connection pipe 13.

Next, a fourth embodiment is explained. The fourth embodiment differs from the first embodiment in a second member 412 constituting a band plate member 41 and a coupling structure of a pair of internal flow paths. Hereinafter, the fourth embodiment is explained focusing on the difference from the first embodiment.

Figure 11:
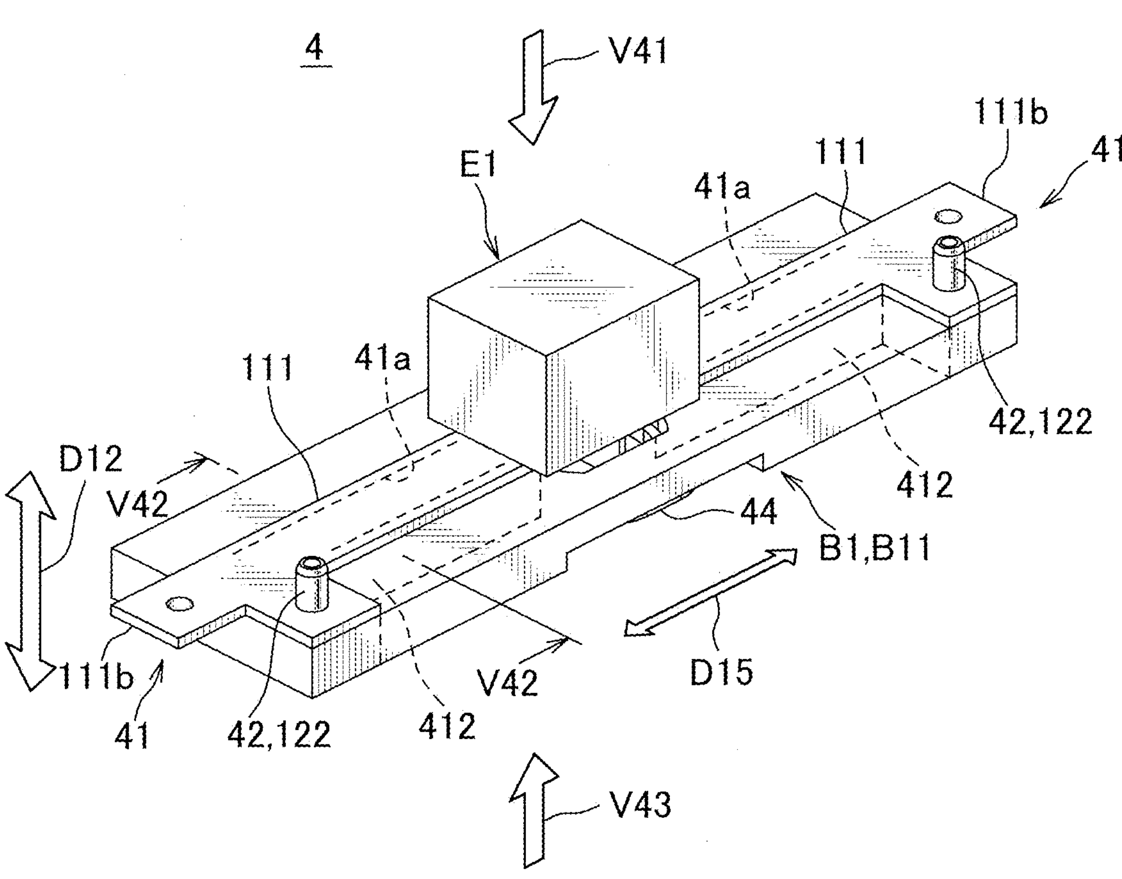
FIG. 11 is a perspective view illustrating a coolant flow path-attached conductive member according to a fourth embodiment.
Figure 12:
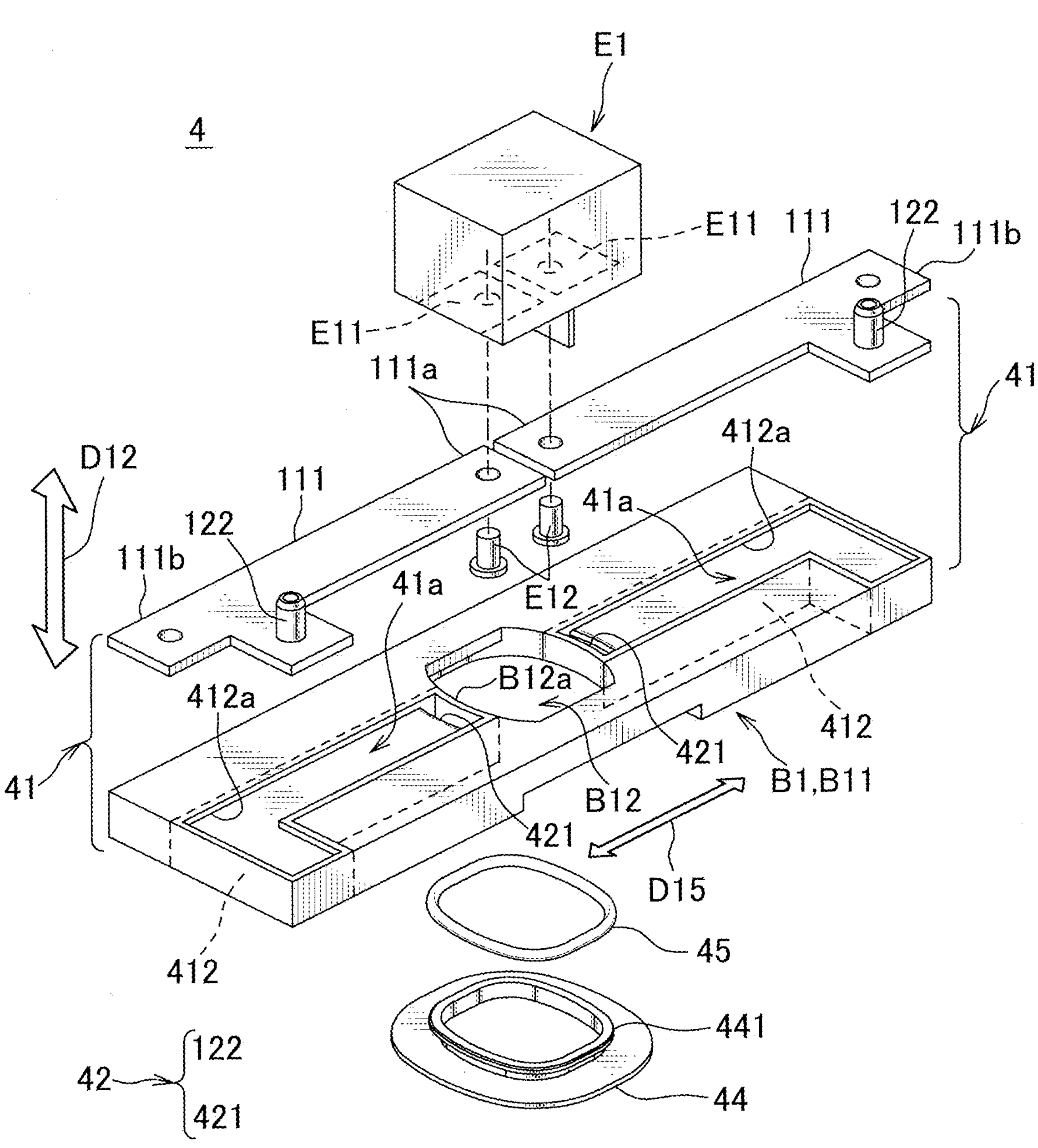
FIG. 12 is an exploded perspective view of the coolant flow path-attached conductive member illustrated in FIG. 11.
Figure 13:
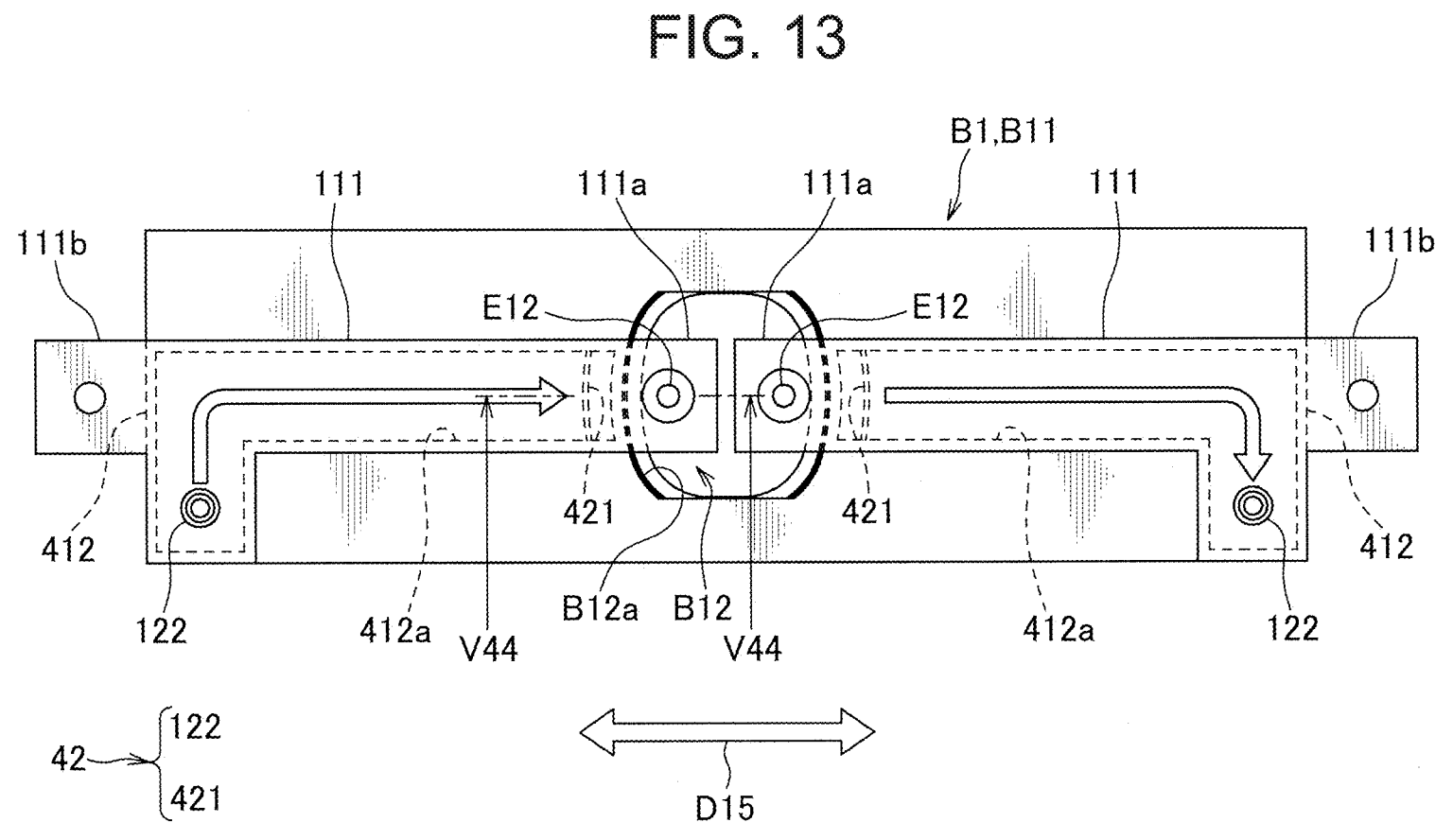
Figure 14:
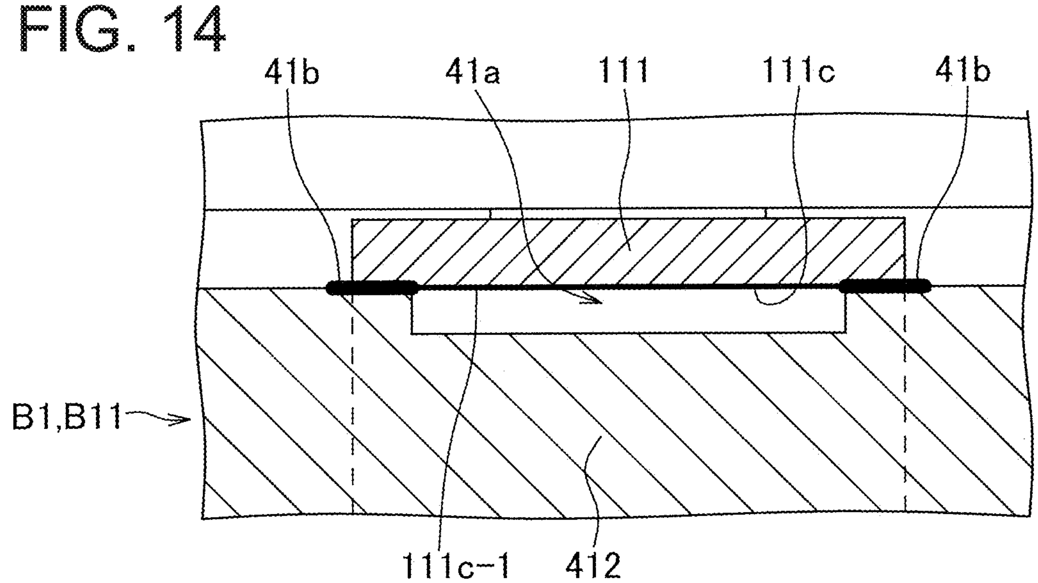
FIG. 14 is a cross-sectional view taken along line V42-V42 of FIG. 11.
Figure 15:
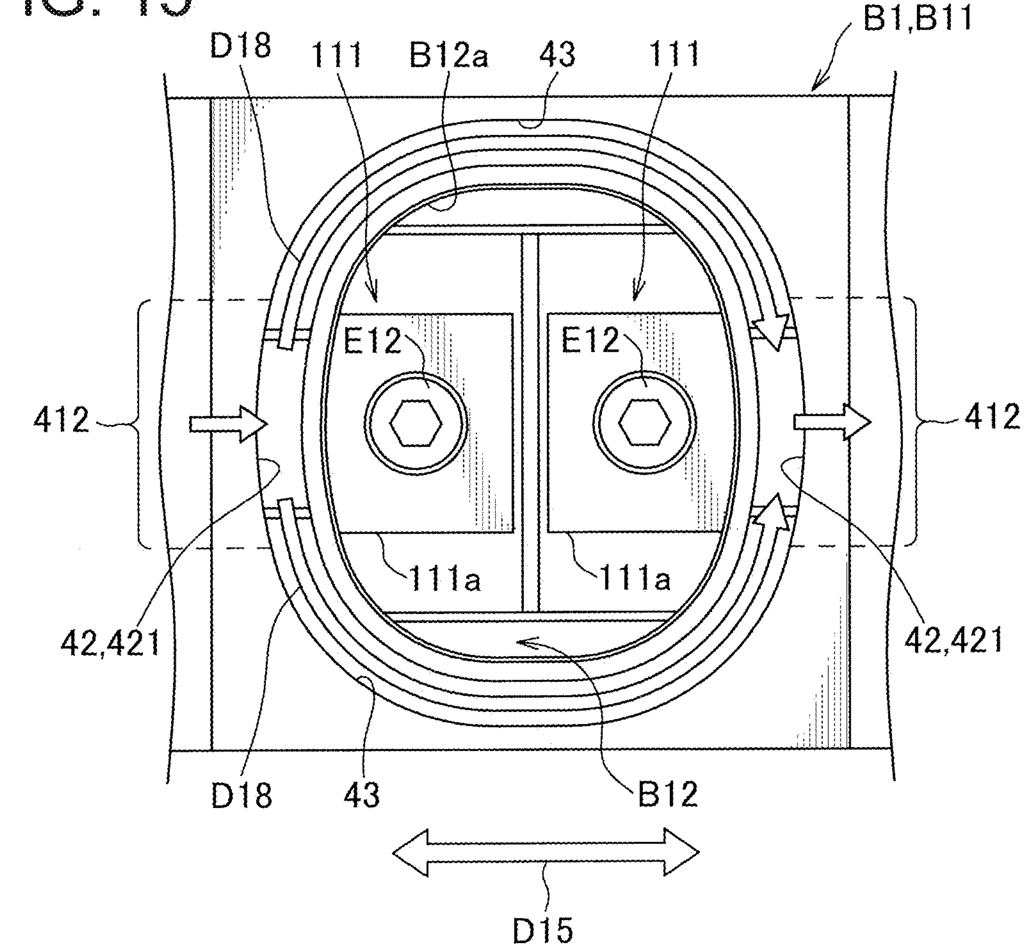
FIG. 15 is a diagram illustrating how a pair of internal flow paths are connected in the coolant flow path-attached conductive member illustrated in FIG. 11, as viewed in the direction of arrow V43 of FIG. 11.
Figure 16:
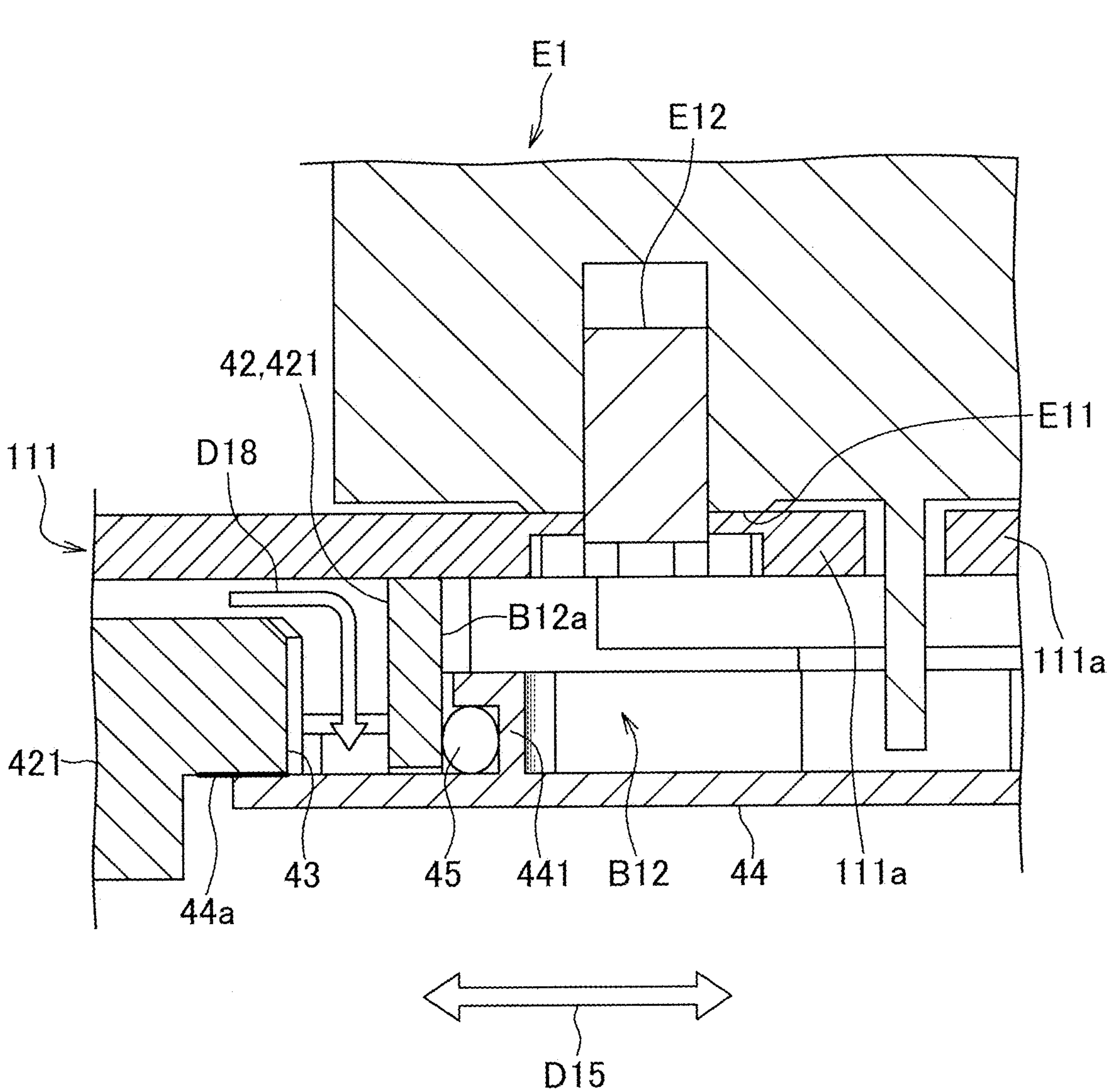
FIG. 16 is a cross-sectional view taken along line V44-V44 of FIG. 13.

FIG. 11 is a perspective view illustrating a coolant flow path-attached conductive member 4 according to the fourth embodiment. FIG. 12 is an exploded perspective view of the coolant flow path-attached conductive member 4 illustrated in FIG. 11. FIG. 13 is a plan view of the coolant flow path-attached conductive member 4 illustrated in FIG. 11, excluding the electric/electronic component, as viewed from the direction of arrow V41 of FIG. 11. FIG. 14 is a cross-sectional view taken along line V42-V42 of FIG. 11. FIG. 15 is a diagram illustrating how a pair of internal flow paths are connected in the coolant flow path-attached conductive member 4 illustrated in FIG. 11, as viewed in the direction of arrow V43 of FIG. 11. FIG. 16 is a cross-sectional view taken along line V44-V44 of FIG. 13. In FIGS. 11 to 16, constituent elements equivalent to those of the first embodiment illustrated in FIGS. 1 to 4 are denoted with the same reference numerals as those in FIGS. 1 to 4 only when they necessary for explanation, and duplicate explanations about those constituent elements are below.

In the coolant flow path-attached conductive member 4 according to the fourth embodiment, the second member 412 constituting the band plate member 41 is an outer wall portion constituting an outer wall B11 of an apparatus housing B1 made of an insulating material. The second component 412 is a groove component in which a flow path groove 412*a* constituting a portion of an internal flow path 41*a* is formed on one of the front and back surfaces of this outer wall portion. The second components 412 are combined in one-to-one manner with the first components 111, i.e., cover components, similar to the first embodiment to constitute the band plate members 41. A pair of second components 412 serving as the outer wall portion formed with flow path grooves 412*a* are formed such that the respective flow path grooves 412*a* extend along the terminal arrangement direction D15 of the pair of component terminals E1 of the electric/electronic component E1.

In this case, a joint between the second component 412, i.e., the outer wall portion made of insulating resin, and the first component 111, which is made of a conductive metal and acts as a busbar, is made by forming a watertight joint portion 41*b* to prevent coolant from leaking from the internal flow path 41*a*, as illustrated in FIG. 14. The watertight joint portion 41*b* is formed by bonding with an adhesive having watertight performance, or by welding the second component 412 to the first component 111 while partially heating and melting the second component 412. Also, in the present embodiment, water, which is a conductive fluid, is used as the coolant that flows through the internal flow path 41*a*. For this reason, in the first component 111, a surface portion 111*c* that constitutes the inner surface of the internal flow path 41*a* is treated to form an insulating coating 111*c*-1 as an insulating treatment.

In the present embodiment, a connection-side port 122 similar to the first embodiment is provided on a side of the first component 111, closer to the target-side connection piece 111*b*, of each of the pair of coolant ports 42. On the other hand, a through hole is provided on a component-side port 421 of each of the pair of coolant ports 42. The through hole penetrating the outer wall portion is provided at a position adjacent to the component-side connection piece 111*a*, i.e., a connection end portion fastened and fixed to the component terminal E11 with a screw E12, in the flow path groove 412*a* of the second component 412.

Through hole connection grooves 43 as illustrated in FIG. 15 and FIG. 16 and a groove cover 44 illustrated in FIG. 12 and FIG. 16 are provided as a coupling structure for the pair of internal flow paths 41*a* constituted such that the pair of flow path grooves 412*a* are covered with the first components 111 in one-to-one correspondence. In this case, an access opening B12 is provided between the pair of second components 412 to allow for performing a task of connecting, with a screw E12, the component-side connection piece 111*a* of the first component 111 and the component terminal E11 from the other surface side opposite the flow path groove 412*a*. The component-side ports 421 are provided at adjacent positions to an inner peripheral edge B12*a* of the access opening B12. The component-side ports 421 are provided at two adjacent positions aligned in the terminal arrangement direction D15 around the inner peripheral edge B12*a* in accordance with the pair of flow path grooves 412*a* extending along the terminal arrangement direction D15. The through hole connection grooves 43 are formed so as to extend from one of the component-side ports 421, branch into two along the inner peripheral edge B12*a* of the access opening B12, and merge at the other of the component-side ports 421, as indicated by an arrow D18. The groove cover 44 is a resin ring plate formed so as to cover the pair of component-side ports 421 and the pair of through hole connection grooves 43 extending along the inner peripheral edges B12*a* of the access opening B12.

As illustrated in FIG. 16, the groove cover 44 is achieved by forming a watertight joint portion 44*a* in the outer wall portion, i.e., the second component 412, to prevent coolant from leaking from the internal flow path 41*a*. In this case, the watertight joint portion 44*a* is formed by bonding with an adhesive having watertight performance, or by welding the second component 412 and the groove cover 44 while partially heating and melting them. As illustrated in FIG. 12 and FIG. 16, the groove cover 44 is configured such that a portion of the groove cover 44 enters the inside of the access opening B12. In addition, a ring-shaped gasket 45 is disposed between this cover-side entry portion 441 and the inner peripheral edge B12*a* of the access opening B12 to provide additional watertightness to prevent coolant from leaking from the internal flow path 41*a* into the inside of the access opening B12.

It is to be understood that according to the coolant flow path-attached conductive member 4 of the fourth embodiment explained above, both a low profile and a large current during energization can be achieved, similar to the first embodiment explained above.

In the present embodiment, the second component 412 is the outer wall portion that is a portion of the outer wall B11 of the apparatus housing B1 and that is formed with the flow path groove 412*a*. The component-side ports 421 of the pair of coolant ports 42 are through holes provided at adjacent positions to the component-side connection pieces 111*a* in the flow path groove 412*a*. On the surface of the outer wall B11 opposite to the flow path groove 412*a*, the through hole connection groove 43 connecting the pair of component-side ports 421 to each other is formed. The groove cover 44 is provided to close the groove opening of the through hole connection groove 43 to form the connection flow path that connects the pair of internal flow paths 41*a*.

According to this configuration, the second component 412 is the outer wall portion of the outer wall B11 of the apparatus housing B1, so that on the side of the flow path groove 412*a*, the size addition in the thickness direction D12 is only the thickness of the first component 111, and accordingly, an even lower profile can be achieved. Further, the connection flow path that connects the pair of internal flow paths 41*a* is composed of the pair of component-side ports 421, each of which is a through hole, the through hole connection groove 43 and the groove cover 44 that connect them. In this connection flow path, the additional size in the thickness direction D12 is only the thickness of the groove cover 44, and in this respect as well, an even lower profile can be achieved.

Furthermore, in the present embodiment, the access opening B12 is provided between the pair of second components 412. The pair of component-side ports 421 are provided at the pair of adjacent positions that is adjacent to the inner peripheral edge B12*a* of the access opening B12. The through hole connection grooves 43 are formed so as to extend on one of the component-side ports 421, branch into two along the inner peripheral edge B12*a*, and merge at the other of the component-side ports 421. According to this configuration, because of the access opening B12, the workability of connecting the first components 111 to the component terminals E11 of the electric/electronic component E1 can be improved. In addition, the component-side ports 421 and the through hole connection grooves 43, which constitute the connection flow path connecting the internal flow paths 41*a*, are arranged to surround the access opening B12, so that this connection flow path can be compactly arranged around the access opening B12. Furthermore, the through hole connection grooves 43 is formed to branch into two along the inner peripheral edge B12*a* of the access opening B12, so that the connection flow path can be made compact while a sufficiently large flow path cross section can be obtained for the connection flow path.

Next, a fifth embodiment is explained. The fifth embodiment differs from the first embodiment in the configuration of an internal flow path in a band plate member and coolant ports. Hereinafter, the fifth embodiment is explained focusing on the difference from the first embodiment.

Figure 17:
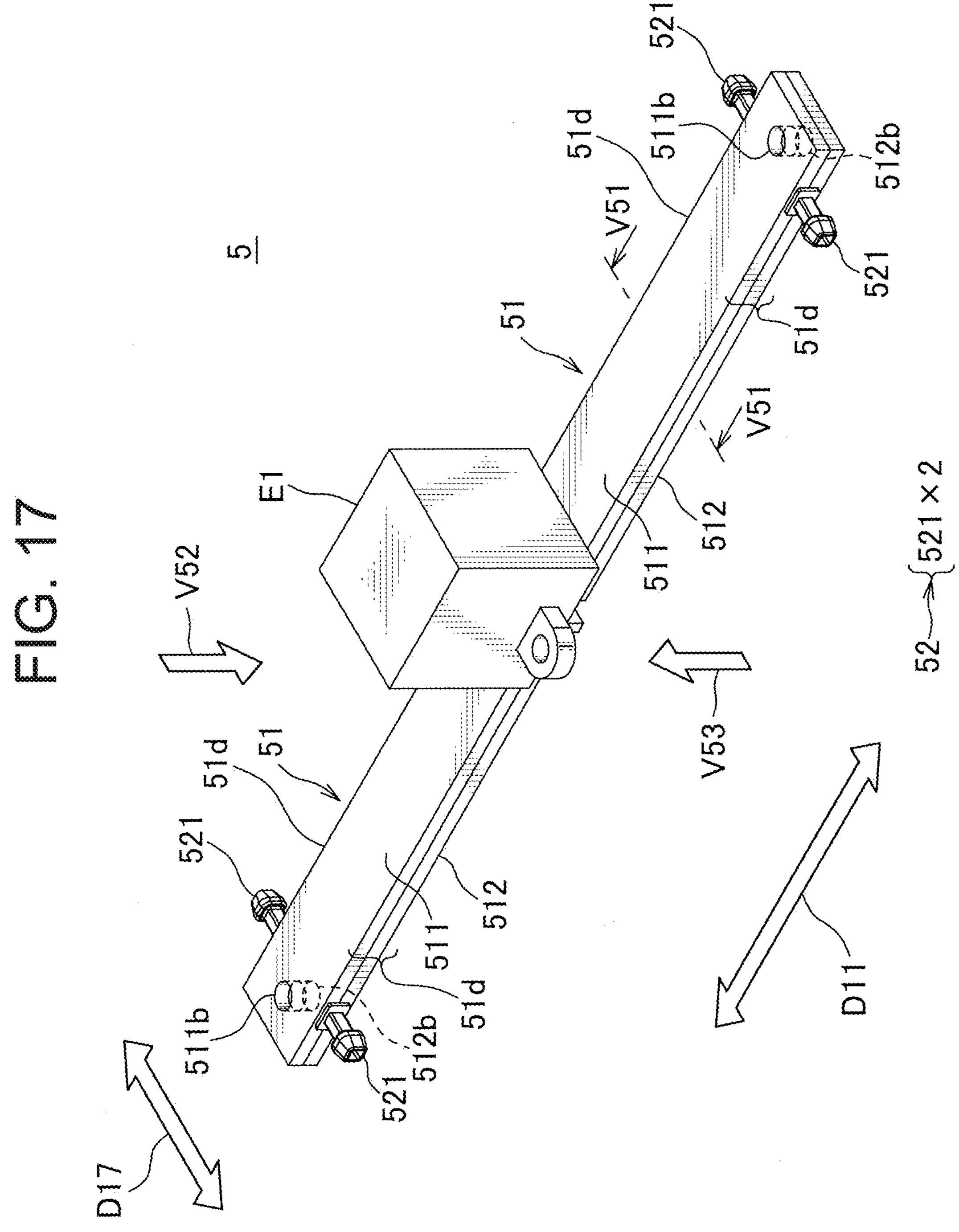
FIG. 17 is a perspective view illustrating a coolant flow path-attached conductive member according to a fifth embodiment.
Figure 18:
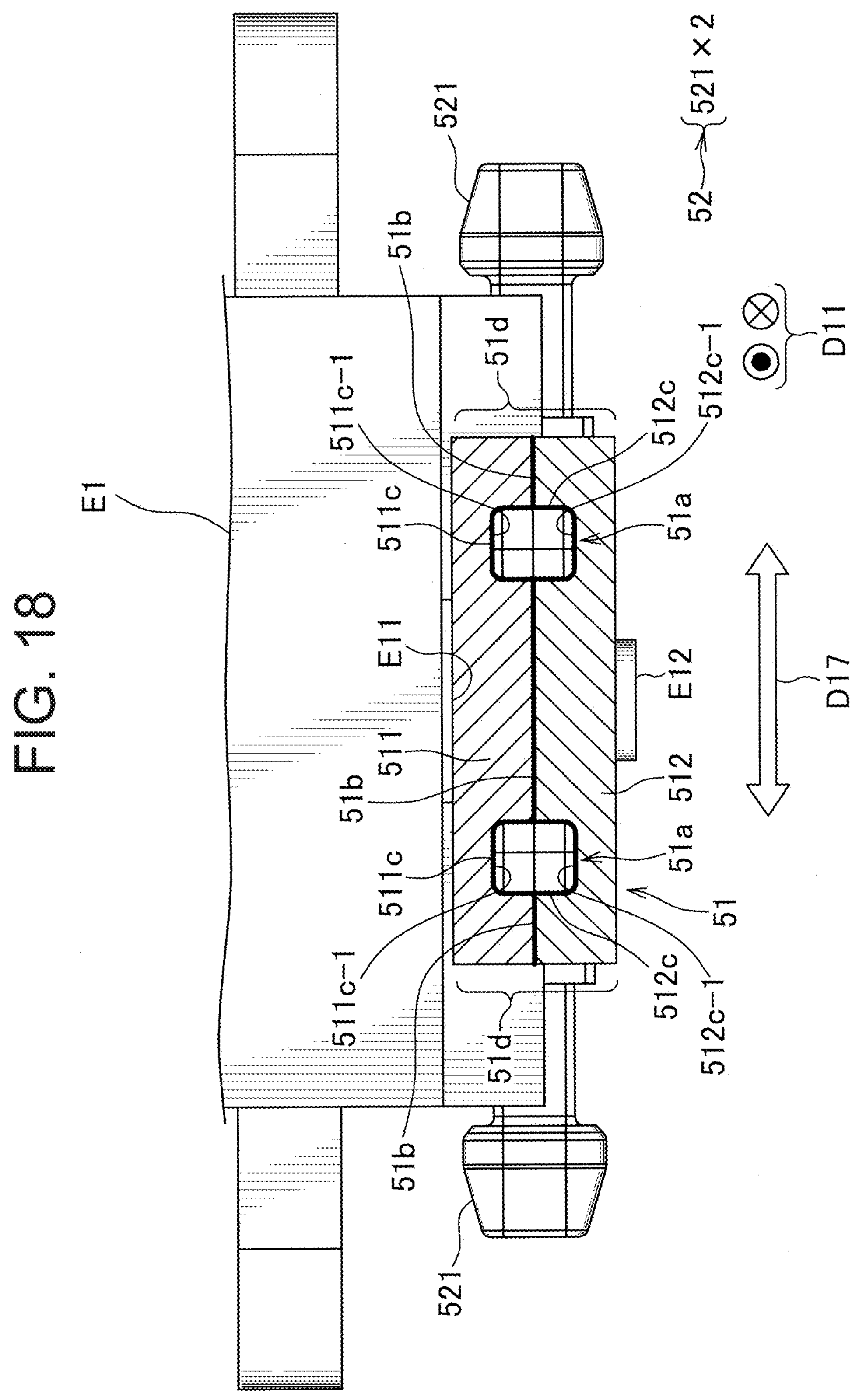
FIG. 18 is a cross-sectional view taken along line V51-V51 in FIG. 17.
Figure 19:
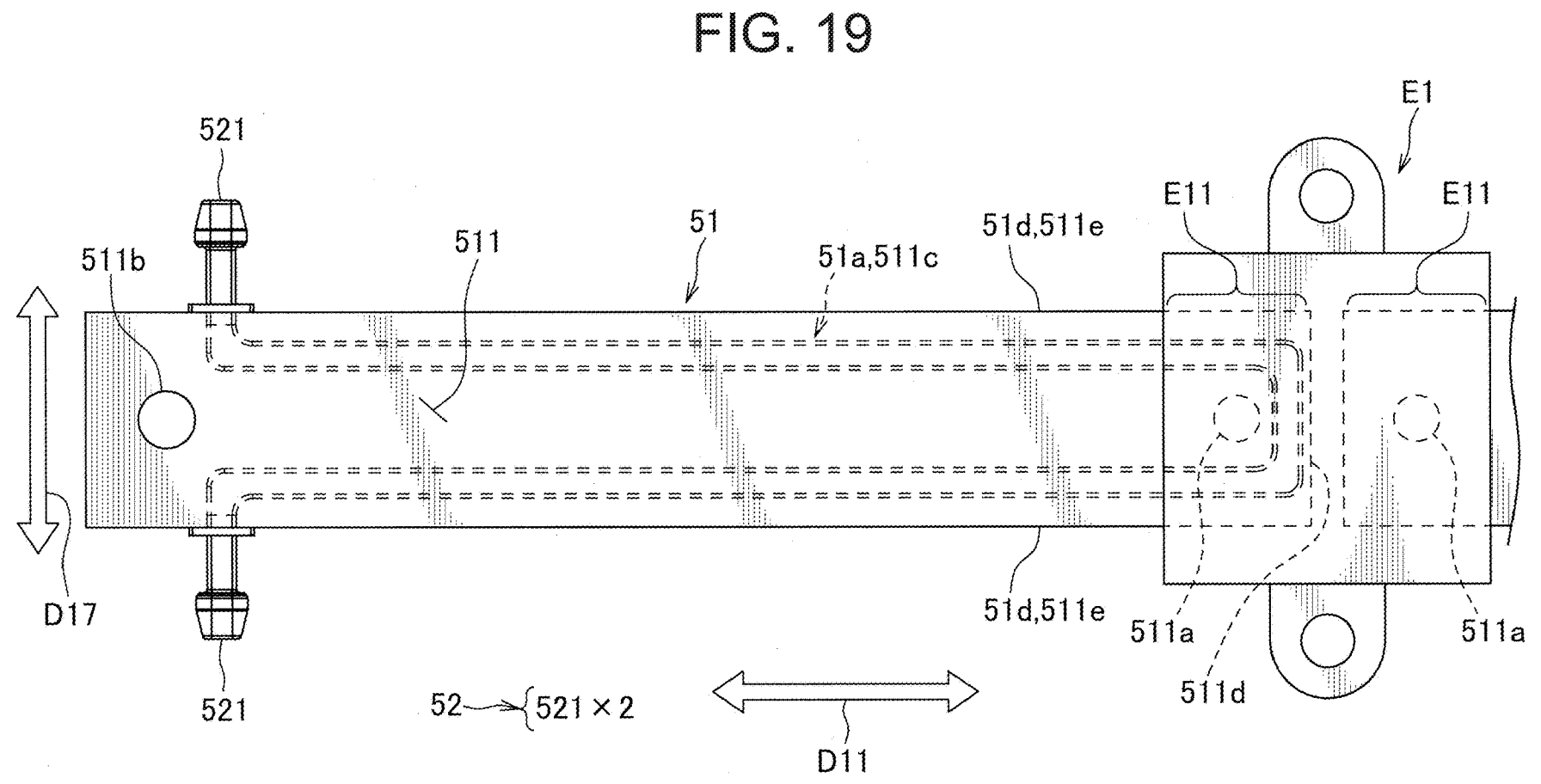
Figure 20:
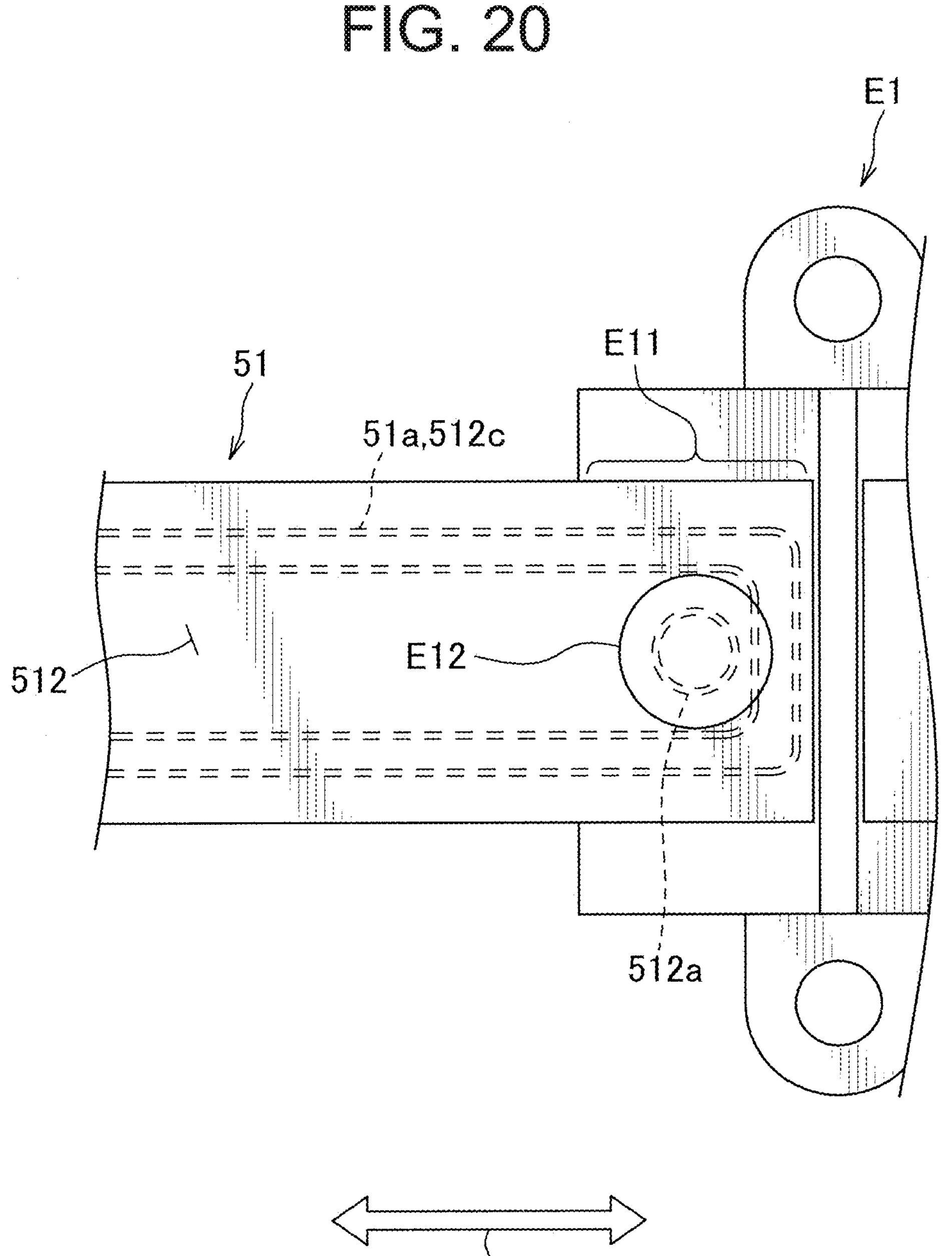
FIG. 20 is a bottom view illustrating a connection portion between the single band plate member and the electric/electronic component illustrated in FIG. 17, together with the internal flow path and the electric/electronic component, as viewed from the direction of arrow V53 of FIG. 17.
Figure 20:
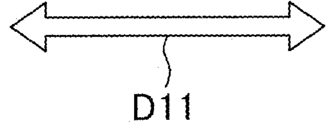

FIG. 17 is a perspective view illustrating a coolant flow path-attached conductive member 5 according to the fifth embodiment. FIG. 18 is a cross-sectional view taken along line V51-V51 in FIG. 17. FIG. 19 is a top view of a single band plate member illustrated in FIG. 17, illustrating an internal flow path and an electric/electronic component as viewed from the direction of arrow V52 of FIG. 17. FIG. 20 is a bottom view illustrating a connection portion between the single band plate member and the electric/electronic component illustrated in FIG. 17, together with the internal flow path and the electric/electronic component, as viewed from the direction of arrow V53 of FIG. 17. In FIGS. 17 to 20, constituent elements equivalent to those of the first embodiment illustrated in FIGS. 1 to 4 are denoted with the same reference numerals as those in FIGS. 1 to 4 only when they necessary for explanation, and duplicate explanations about those constituent elements are below.

In the coolant flow path-attached conductive member 5 according to the fifth embodiment, one end side of each of band plate members 51 is on the connection side with the component terminal E11 of the electric/electronic component E1, and the other end side thereof is a connection side with the electrical connection target. Each side is fastened and fixed to a corresponding member with a screw. The band plate member 51 is composed of a first component 511 and a second component 512 made of a conductive metal, which are rectangular plates that are mirror symmetry with respect to each other.

One end side of the first component 511 is formed with a first component-side screw through hole 511*a* to be penetrated by a screw E12 for fastening the component terminal E11, and the other end side thereof is formed with a first target-side screw through hole 511*b* for similarly fastening the electrical connection target. Also, a first flow path groove 511*c* constituting a portion of an internal flow path 51*a* is formed on one of the front and back surfaces of the first component 511. The first flow path groove 511*c* is a groove that passes, on the side of the component terminal E11, between: the first component-side screw through hole 511*a*; and the end surface 511*d* on the side of the component terminal E11 and the pair of side surfaces 511*e* extending along the length direction D11, such that the first flow path groove 511*c* surrounds in a U shape the first component-side screw through hole 511*a*.

The second component 512 has a mirror symmetrical shape with respect to the first component 511, and is combined with the surface of the first component 511, on which the first flow path groove 511*c* is formed, so as to be overlapped thereon to constitute the band plate member 51. The second component 512 is formed with a second component-side screw through hole 512*a* and a second target-side screw through hole 512*b* that are in communication with the first component-side screw through hole 511*a* and the first target-side screw through hole 511*b*, respectively, in one-to-one correspondence. Also, a second flow path groove 512*c* is formed on the opposing surface to the surface formed with the first flow path groove 511*c*, and overlaps with the first flow path groove 511*c* to form the internal flow path 51*a*.

The first component 511 and the second component 512 are joined by overlapping the surface formed with the first flow path groove 511*c* and the surface formed with the second flow path groove 512*c*, and forming a watertight joint portion 51*b* at the boundary between the two to prevent coolant from leaking from the internal flow path 51*a*. The watertight joint portion 51*b* is formed by bonding with an adhesive having watertight performance. Also, in the present embodiment, water, which is a conductive fluid, is used as the coolant. Accordingly, an insulating treatment is applied to the inner surface of the first flow path groove 511*c* to form an insulating coating 511*c*-1 that electrically insulates the coolant and the first component 511. In addition, an insulating treatment is also applied to the inner surface of the second flow path groove 512*c* to form a similar insulating coating 512*c*-1.

Furthermore, in the present embodiment, the internal flow path 51*a* thus formed is open at each of a pair of band side surfaces 51*d* along the length direction D11 of the band plate member 51, and extends between the pair of band side surfaces 51*d*, bending in a U-shape as described above. The opening positions of the internal flow path 51*a* on the pair of band side surfaces 51*d* are coaxial in the width direction D17 of the band plate member 51 near the first target-side screw through hole 511*b* and the second target-side screw through hole 512*b*. Furthermore, the pair of coolant ports 52 are nipple members 521 attached to the openings of the internal flow path 51*a* on each of the band side surfaces 51*d* to connect predetermined pipes and the internal flow path 51*a*.

It is to be understood that according to the coolant flow path-attached conductive member 5 of the fifth embodiment explained above, both a low profile and a large current during energization can be achieved, similar to the first embodiment explained above.

In the present embodiment, the first component 511 is formed with the first flow path groove 511*c* that passes between the pair of side surfaces 511*e* and that surrounds in a U shape the first component-side screw through hole 511*a*, and the second component 512 is formed with the similar second flow path groove 512*c*. According to this configuration, the first component 511 and the second component 512, which are two mirror-symmetric plate members, are overlapped, so that the band plate member 51, i.e., the coolant flow path-attached conductive member 5, can be made into an even lower profile. In addition, since the internal flow path 51*a* is configured to surround in a U-shape the first component-side screw through hole 511*a* and the second screw through hole 512*a* used for connection with the component terminal E11, the connection portion around the screw can be effectively cooled, which otherwise tends to generate a lot of heat when a current is applied.

Also, in the present embodiment, water, which is a conductive fluid, is used as the coolant, the insulating treatment is applied to the inner surface of the first flow path groove 511*c*, and the similar insulating treatment is applied to the inner surface of the second flow path groove 512*c*. According to this configuration, both of the first component 511 and the second component 512 are formed of a conductive metal, so that the electrical resistance of the coolant flow path-attached conductive member 5 can be reduced. Furthermore, by applying the insulating treatment to the inner surface of the first flow path groove 511*c* and the inner surface of the second flow path groove 512*c*, the coolant can be electrically isolated from the current passing through the coolant flow path-attached conductive member 5, while allowing the use of a common coolant such as water.

Furthermore, in the present embodiment, the internal flow path 51*a* is open on each of the pair of band side surfaces 51*d* of the band plate member 51, and extends from one of the pair of band side surfaces 51*d* to the other of the pair of band side surfaces 51*d* while bending in a U shape along the way. Furthermore, the pair of coolant ports 52 are nipple members 521 attached to respective openings of the internal flow path 51*a*. According to this configuration, the nipple members 521 are attached to the openings of the internal flow path 51*a* on each of the pair of band side surfaces 51*d* of the band plate member 51, so that the connection with other pipes can also be made into a low profile.

Next, a sixth embodiment is explained. The sixth embodiment is a modified embodiment of the fifth embodiment explained above, and is different from the fifth embodiment in the shape of an internal flow path, and the associated positions of coolant ports. Hereinafter, the sixth embodiment is explained focusing on the difference from the fifth embodiment.

Figure 21:
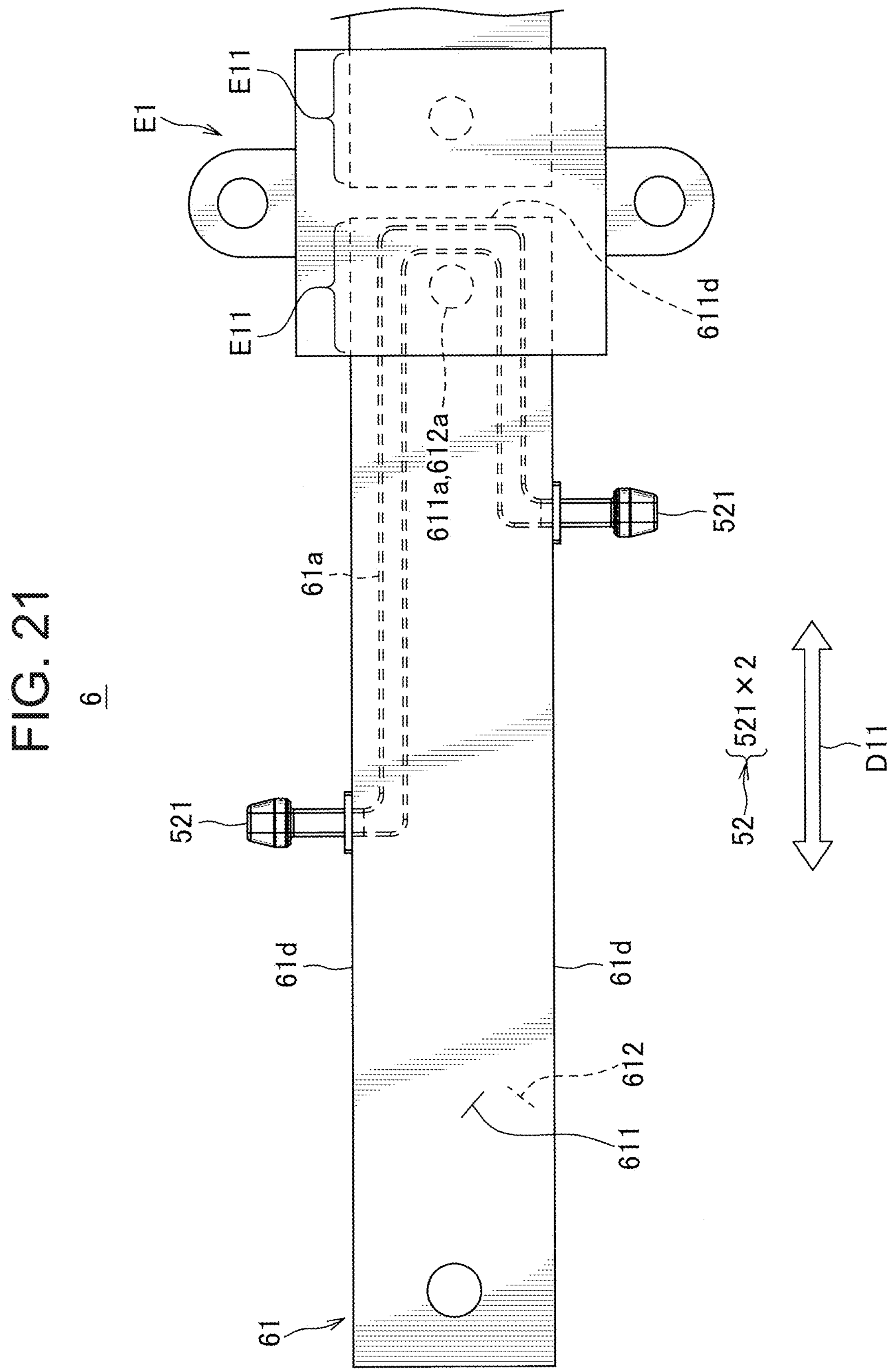
FIG. 21 is a diagram illustrating a coolant flow path-attached conductive member according to a sixth embodiment in a top view similar to FIG. 19 according to the fifth embodiment.

FIG. 21 is a diagram illustrating a coolant flow path-attached conductive member 6 according to the sixth embodiment in a top view similar to FIG. 19 according to the fifth embodiment. In FIG. 21, constituent elements equivalent to those of the fifth embodiment illustrated in FIGS. 17 to 20 are denoted with the same reference numerals as those in FIGS. 17 to 20 only when they necessary for explanation, and duplicate explanations about those constituent elements are below.

The coolant flow path-attached conductive member 6 according to the sixth embodiment is the same as the fifth embodiment in that an internal flow path 61*a* of the band plate member 61 is formed to surround in a U shape a first component-side screw through hole 611*a* of a first member 611 and a second component-side screw through hole 612*a* of a second member 612. However, in the present embodiment, the opening positions of the internal flow path 61*a* on the pair of band side surfaces 61*d* are different from the fifth embodiment. Specifically, the opening position of one of the band side surfaces 61*d* is a substantially central position in the length direction D11, whereas the opening position of the other of the band side surfaces 61*d* is a position shifted to an end surface 611*d* on the side of the component terminal E11 of the electric/electronic component E1. Nipple members 521 similar to those of the fifth embodiment are attached, as the pair of coolant ports 52, to these openings at different positions.

It is to be understood that according to the coolant flow path-attached conductive member 6 of the sixth embodiment explained above, like the fifth embodiment explained above, both a low profile and a large current during energization can be achieved, similar to the first embodiment explained above.

The fifth embodiment and the sixth embodiment explained above show, for example, the coolant flow path-attached conductive member 5, 6 of which the attachment positions of the nipple members 521, serving as the coolant ports 52, are different on the band side surfaces 51*d*, 61*d* of the band plate members 51, 61. As described above, in the fifth embodiment and the sixth embodiment, the coolant ports can be set to any position during design.

Next, a seventh embodiment is explained. The seventh embodiment is a modification of the fifth embodiment explained above, and is different from the fifth embodiment in that multiple coolant flow path-attached conductive members are connected in the width direction. Hereinafter, the seventh embodiment is explained focusing on the difference from the fifth embodiment.

Figure 22:
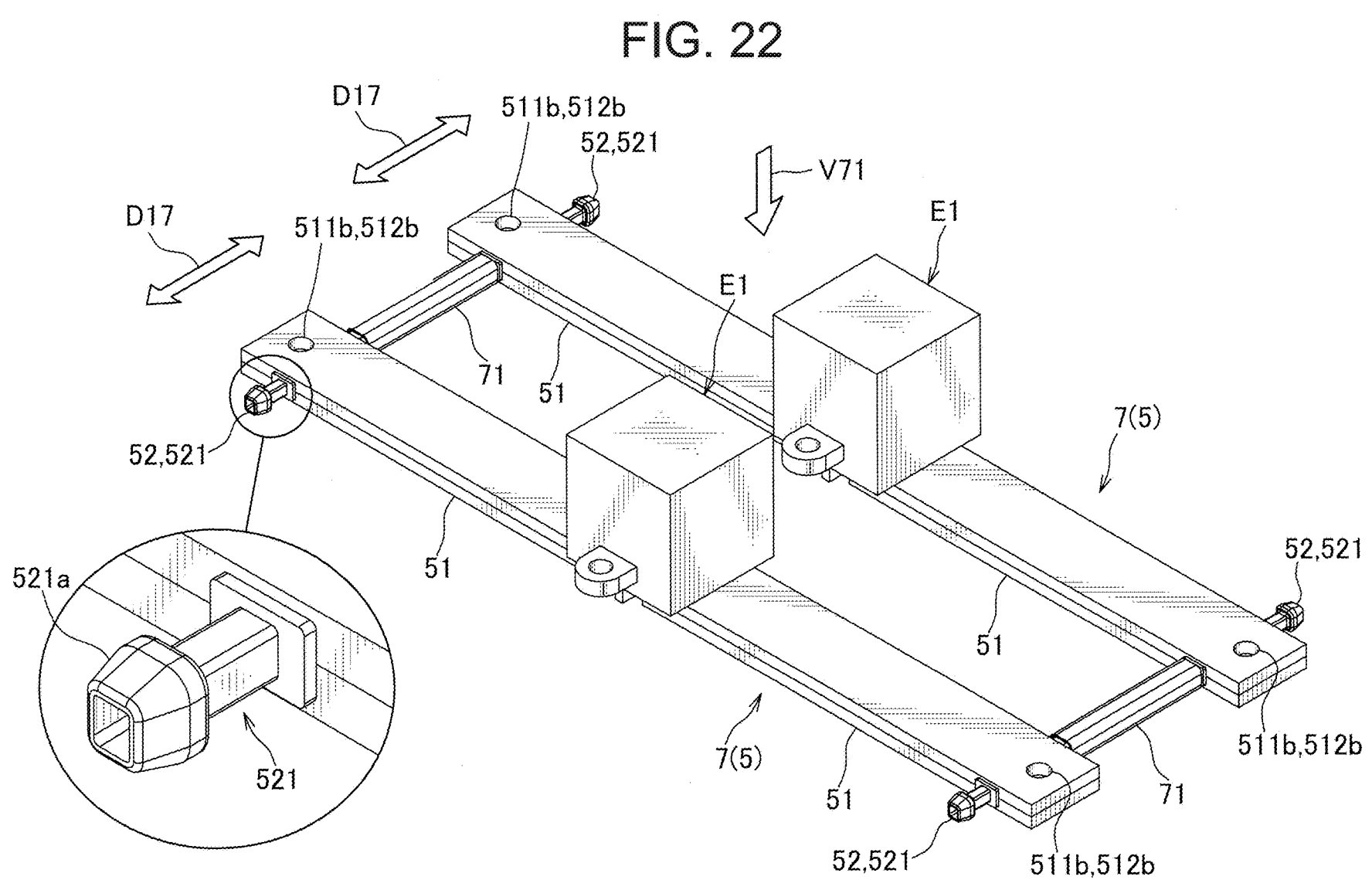
Figure 23:
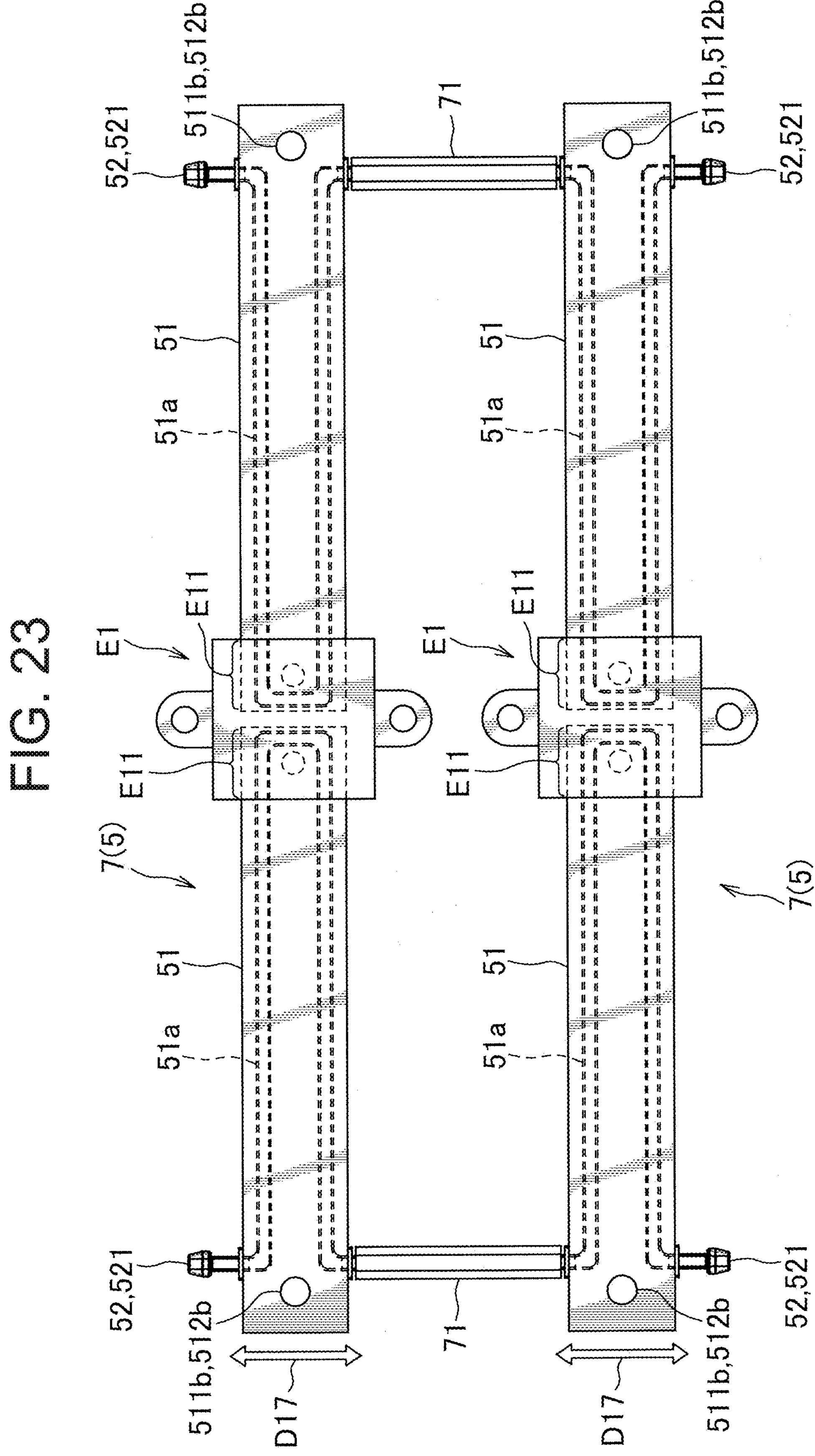
FIG. 23 is a plan view of the coolant flow path-attached conductive member illustrated in FIG. 22, as viewed from the direction of arrow V71 of FIG. 22.

FIG. 22 is a perspective view illustrating a coolant flow path-attached conductive member 7 according to the seventh embodiment. FIG. 23 is a plan view of the coolant flow path-attached conductive member 7 illustrated in FIG. 22, as viewed from the direction of arrow V71 of FIG. 22. In FIGS. 22 and 23, constituent elements equivalent to those of the fifth embodiment illustrated in FIGS. 17 to 20 are denoted with the same reference numerals as those in FIGS. 17 to 20 only when they necessary for explanation, and duplicate explanations about those constituent elements are below.

The coolant flow path-attached conductive member 7 according to the seventh embodiment per se has the same configuration as the coolant flow path-attached conductive member 5 according to the fifth embodiment explained above. However, in the present embodiment, multiple (in this illustrated example, two) electric/electronic components E1, with which connections are to be made, are arranged straight in the width direction D17 of the band plate members 51 connected to the component terminals E11. Nipple members 521 of coolant ports 52 of one of the pair of band plate members 51 corresponding to the pair of adjacent electric/electronic components E1 and nipple members 521 of coolant ports 52 of the other of the pair of adjacent band plate members 51 are arranged straight in the width direction D17. The nipple members 521 thus arranged are connected by a straight pipe 71 extending in the width direction D17. A retaining portion 521*a* that enters the inside of the straight pipe 71 to retain the pipe inner surface from the inside is formed on the tip portion of each of the nipple members 521. As explained with respect to the fifth embodiment, the nipple members 521 of the pair of coolant ports 52 of any given one band plate member 51 are coaxial in the width direction D17 of the band plate member 51 near the first target-side screw through hole 511*b* and the second target-side screw through hole 512*b*. Accordingly, in the present embodiment, two band plate members 51 of the same type, i.e., two coolant flow path-attached conductive members 5 of the same type, can be simply arranged in the width direction D17 to connect adjacent nipple members 521 with the straight pipe 71. As a result, the internal flow paths 51*a* of the adjacent band plate members 51 are connected by the straight pipe 71.

It is to be understood that according to the coolant flow path-attached conductive member 7 of the seventh embodiment explained above, both a low profile and a large current during energization can be achieved, similar to the fifth embodiment explained above.

Furthermore, in the present embodiment, the coolant port 52 of one of the pair of adjacent band plate members 51 and the coolant port 52 of the other of the pair of adjacent band plate members 51 are arranged straight in the width direction D17 and are connected by the straight pipe 71 extending in the width direction D17. According to this configuration, the internal flow paths 51*a* of the multiple coolant flow path-attached conductive members 7 are connected by the straight pipes 71, so that the overall configuration of the coolant flow path for cooling the electrical connections of the multiple electric/electronic components E1 can be simplified. This simplification makes it possible to reduce the space and weight of the entire configuration for cooling for the electrical connections of the multiple electric/electronic components E1.

Next, an eighth embodiment is explained. The eighth embodiment is a modified embodiment of the seventh embodiment explained above, and is different from the seventh embodiment in the connection position of a straight pipe. Hereinafter, the eighth embodiment is explained focusing on the difference from the seventh embodiment.

Figure 24:
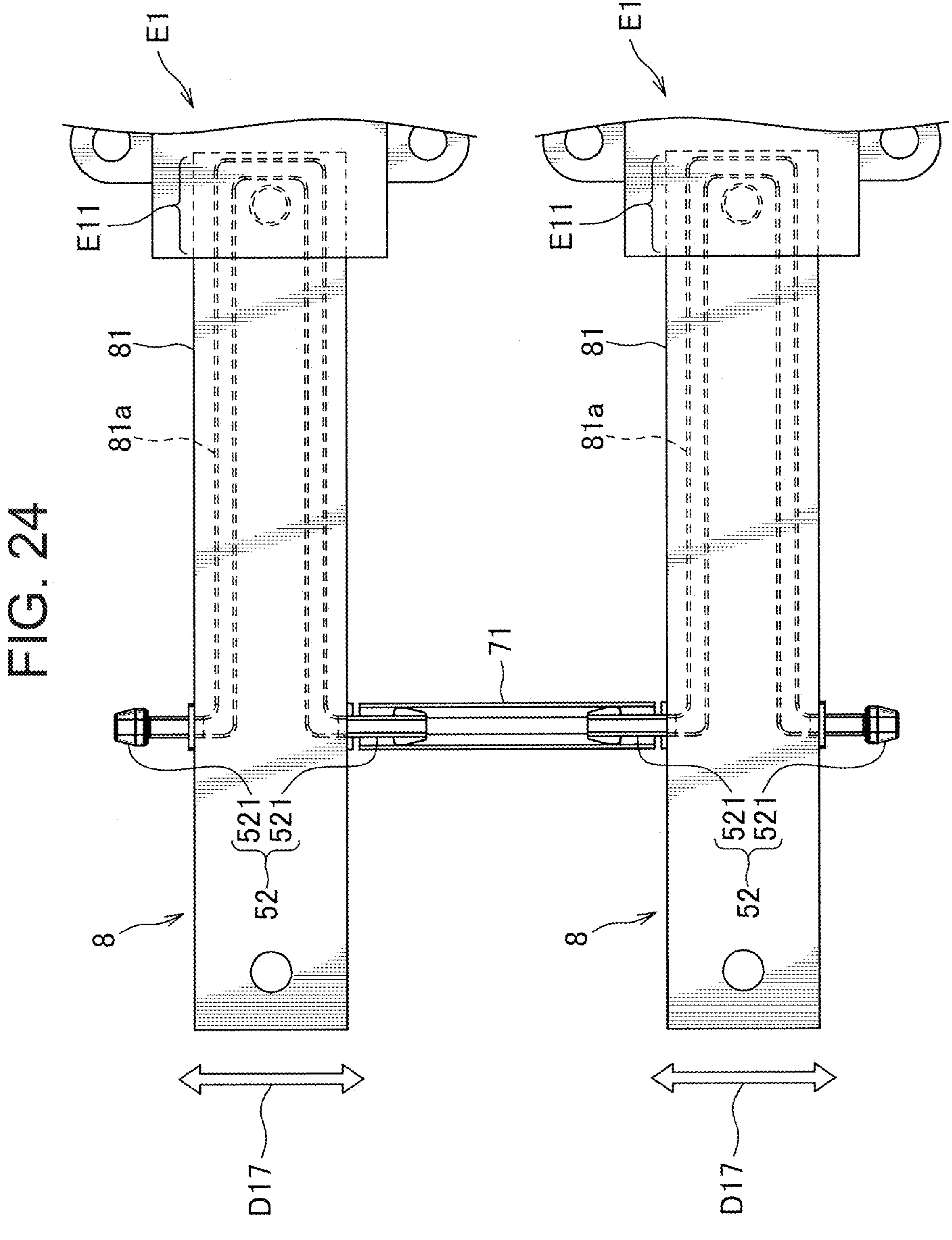
FIG. 24 is a plan view, equivalent to FIG. 23, of a coolant flow path-attached conductive member according to an eighth embodiment, illustrating only a pair of adjacent band plate members connected by a single straight pipe.

FIG. 24 is a plan view, equivalent to FIG. 23, of a coolant flow path-attached conductive member according to the eighth embodiment, illustrating only a pair of adjacent band plate members connected by a single straight pipe. In FIG. 24, constituent elements equivalent to those of the seventh embodiment illustrated in FIG. 22 and FIG. 23 are denoted with the same reference numerals as those in FIG. 22 and FIG. 23 only when they necessary for explanation, and duplicate explanations about those constituent elements are below.

In the coolant flow path-attached conductive member 8 according to the eighth embodiment, the opening positions of internal flow paths 81*a* of band plate members 81 are situated at positions slightly shifted to the component terminal E11 of the electric/electronic component E1, as compared with the seventh embodiment. Nipple member 521 constituting coolant ports 52 are attached at positions closer to the component terminal E11, and the adjacent nipple members 521 are connected by a straight pipe 71 at a position closer to the component terminal E11, so that the internal flow paths 81*a* are connected to each other. In the present embodiment, the opening positions of the internal flow paths 81*a* of each of the band plate members 81, i.e., the attachment positions of the nipple members 521, are arranged coaxially in the width direction D17. Accordingly, by using this arrangement, two coolant flow path-attached conductive members 8 of the same type can be simply arranged in the width direction D17 to connect adjacent nipple members 521 with the straight pipe 71.

It is to be understood that according to the coolant flow path-attached conductive member 8 of the eighth embodiment explained above, both a low profile and a large current during energization can be achieved, similar to the seventh embodiment explained above.

Next, a ninth embodiment is explained. The ninth embodiment is a modified embodiment of the seventh embodiment explained above, and is different from both the seventh embodiment and the eighth embodiment in the connection position of the straight pipe. Hereinafter, the ninth embodiment is explained focusing on the difference from the seventh embodiment and the eighth embodiment.

Figure 25:
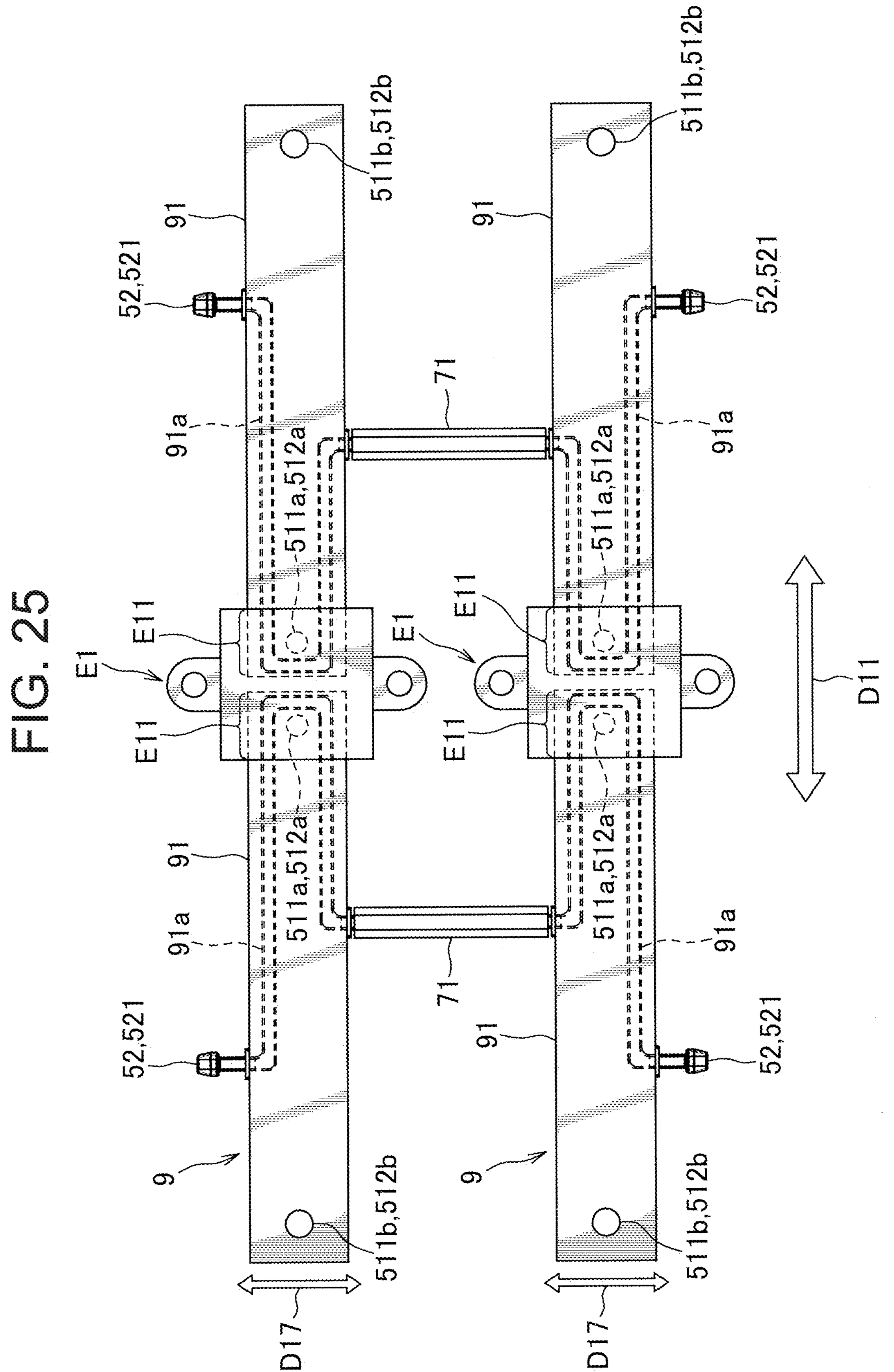
FIG. 25 is a plan view, equivalent to FIG. 23, of a coolant flow path-attached conductive member according to a ninth embodiment.

FIG. 25 is a plan view, equivalent to FIG. 23, of a coolant flow path-attached conductive member 9 according to the ninth embodiment. In FIG. 25, constituent elements equivalent to those of the seventh embodiment illustrated in FIG. 22 and FIG. 23 are denoted with the same reference numerals as those in FIG. 22 and FIG. 23 only when they necessary for explanation, and duplicate explanations about those constituent elements are below.

In the coolant flow path-attached conductive member 9 according to the ninth embodiment, the opening positions of the internal flow paths 91*a* of the band plate members 91, i.e., the nipple members 521 of the coolant ports 52, are not arranged coaxially in the width direction D17. One of the pair of nipple members 521 is provided closer to the component terminal E11 of the electric/electronic component E11 than the center in the length direction D11, and the other of the pair of nipple members 521 is provided closer to the first target-side screw through hole 511*b* and the second target-side screw through hole 512*b*. The internal flow path 91*a* connects the nipple members 521, which are at positions shifted in this way in the length direction D11, such that the internal flow path 91*a* is in a bent shape that surrounds in a U-shape the first component-side screw through hole 511*a* and the second component-side screw through hole 512*a*.

Here, in the present embodiment, the attachment positions of the nipple members 521 to the band plate members 91 are shifted in the length direction D11. Due to this shift, even if two coolant flow path-attached conductive members 9 are simply arranged in the width direction D17, the nipple members 521 of the coolant ports 52 cannot be connected by the straight pipe 71. Therefore, in the present embodiment, the following configuration is employed so that the nipple member 521 of one of the coolant ports 52 and the nipple member 521 of the other of the coolant ports 52 are arranged straight in the width direction D17 and connected by a straight pipe 71. Specifically, in the present embodiment, between two adjacent coolant flow path-attached conductive members 9, one of the band plate members 91 in an inverted state with respect to the other of the band plate members 91 is connected to the component terminal E11 of each of the electric/electronic members E1.

It is to be understood that according to the coolant flow path-attached conductive member 9 of the ninth embodiment explained above, both a low profile and a large current during energization can be achieved, similar to the seventh embodiment explained above.

Furthermore, the seventh to ninth embodiments explained above show, for example, the coolant flow path-attached conductive members 7 to 9 of which relative positions, in the length direction D11, of the pair of coolant ports 52 of any given one band plate member 51, 81, 91 are different. As described above, in the seventh to ninth embodiments, the coolant ports can be set to any position during design. However, in a case where the coolant ports 52 constituting the pair are set at positions shifted from each other in the length direction D11, the coolant ports 52 can be connected by the straight pipe 71 by making one of the pair of adjacently arranged band plate members 91 be in an inverted state with respect to the other of the band plate members 91, which is as explained in the ninth embodiment.

It should be noted that the first to ninth embodiments explained above merely show representative forms of the coolant flow path-attached conductive members. The coolant flow path-attached conductive members are not limited thereto and can be modified in various ways.

For example, the embodiment explained above show, as examples of coolant flow path-attached conductive members, the coolant flow path-attached conductive member 1, . . . , 9 for connecting the pair of component terminals E11 of a relay, i.e., the electric/electronic component E1, to the electrical connection target. However, the coolant flow path-attached conductive members are not limited thereto, and the electric/electronic components, with which connections are to be made, may be an electric component other than a relay, or may be other electronic components.

The embodiments explained above show, as examples of coolant flow path-attached conductive members, the coolant flow path-attached conductive member 1, . . . , 9 of liquid cooling type in which water, which is a conductive fluid, as a coolant flows through the internal flow path 11*a*, . . . , 91*a*. However, the coolant flow path-attached conductive members are not limited thereto, and the coolant may be a non-conductive liquid, or may be cooling gas. When the non-conductive liquid or the cooling gas is employed as the coolant, insulating treatment is no longer required on the inner surface of the first component made of a conductive metal in the internal flow path.

Furthermore, the embodiments explained above show, as examples of coolant flow path-attached conductive members, the coolant flow path-attached conductive member 1, . . . , 9 having the pair of band plate members 11, . . . , 91. However, the coolant flow path-attached conductive members are not limited thereto, and a coolant flow path-attached conductive member may include only one band plate member, three or more band plate members, or the like. In a case where a coolant flow path-attached conductive member includes only one band plate member, the one band plate member functions as a coolant flow path-attached conductive member per se.

The first to fourth embodiments explained above show, as examples of coolant flow path-attached conductive members, the coolant flow path-attached conductive member 1, . . . , 4, in which the internal flow paths 11*a*, . . . , 41*a* of the pair of band plate members 11, . . . , 41 are connected by the flat connection pipe 13 or the through hole connection groove 43. However, the coolant flow path-attached conductive members are not limited thereto. For example, as indicated in the fifth to ninth embodiments, the coolant flow path-attached conductive member may include the pair of band plate members 51, . . . , 91 that are not connected to each other. Among them, in the examples in the seventh to ninth embodiments, the band plate members 51, . . . , 91 is connected to the band plate members 51, . . . , 91 of another coolant flow path-attached conductive member 7, . . . , 9 via the straight pipes 71. Each of the pair of band plate members 51, 81, 91 that are not connected in any given one coolant flow path-attached conductive member 5, . . . , 9 can be said to function as an independent coolant flow path-attached conductive member.

The first to third and fifth to ninth embodiments explained above show, as examples of band plate members, the band plate members 11, . . . , 31, 51, 81, 91 in which both the first component 111, . . . 311, 511 and the second component 112, . . . 312, 512 are made of a conductive metal. The fourth embodiment explained above shows, as an example of band plate member, the band plate member 41 in which the first component 111 is made of a conductive metal, and the second component 412 is the outer wall portion constituting a portion of the outer wall B11 of the apparatus housing B1 made of an insulating material. However, the band plate member is not limited thereto, and if the first component that provides electrical connection of the electric/electronic component is made of a conductive metal, the second component may be made of an insulating material regardless of its shape.

List of Reference Signs

1, 2, 3, 4, 5, 6, 7, 8, 9 coolant flow path-attached conductive member
11, 21, 31, 41, 51, 61, 81, 91 band plate member
11*a*, 31*a*, 41*a*, 51*a*, 61*a*, 81*a*, 91*a* internal flow path
11*b*, 13*a*, 41*b*, 44*a*, 51*b* watertight joint portion
12, 32, 42, 52 coolant port
13 flat connection pipe
43 through hole connection groove
44 groove cover

45 gasket
51*d*, 61*d* band side surface
71 straight pipe
111, 211, 311, 511, 611 first component
111*a*, 211*a*, 311*a* component-side connection piece
111*a*-1, 111*b*-1 through hole
111*b*, 211*b*, 311*b* target-side connection piece
111*c*, 112*b*, 311*c* surface portion
111*c*-1, 112*b*-1, 311*c*-1, 511*c*-1, 512*c*-1 insulating coating
111*d* external surface
112, 212, 312, 412, 512, 612 second component
112*a* groove opening
121, 321, 421 component-side port (flow path opening, through hole)
122, 322 connection-side port (tube shape protrusion)
131 flat groove member
132 one of surfaces
133 heat transfer material
412*a* flow path groove
441 cover-side entry portion
511*a*, 611*a* first component-side screw through hole
511*b* first target-side screw through hole
511*c* first flow path groove
511*d*, 611*d* end surface
511*e* side surface
512*a*, 612*a* second component-side screw through hole
512*b* second target-side screw through hole
512*c* second flow path groove
521 nipple member
521*a* retaining portion
B1 apparatus housing
B11 outer wall
B12 access opening
B12*a* inner peripheral edge
D11 length direction
D12, D14 thickness direction
D13 right angle extension direction
D15 terminal arrangement direction
D16 orthogonal direction
D17 width direction
D18 arrow
E1, E3 electric/electronic component
E3*a* terminal surface
E3*b* one side edge
E3*c* adjacent external surface
E11 component terminal
E12, E32 screw
P31 surface contact position
T11 thickness size
T12 pipe thickness size
W11 width size
W12 pipe width size

What is claimed is:

1. A coolant flow path-attached conductive member comprising:

a first component that has one of divided shapes that are obtained by dividing, into two in a thickness direction, a band plate member including an internal flow path, the band plate member being in a shape of a flat band plate in which a thickness size is shorter than a width size and having the internal flow path that allows a coolant to pass at least in a length direction thereof, the first component being made of a conductive metal, one end side of the first component being connected to a component terminal of a predetermined electric/electronic component, the other end side being connected to and in electrical connection with an electrical connection target of the electric/electronic component;

a second component that has the other of the divided shapes and that is combined with the first component to constitute the band plate member; and a pair of coolant ports provided on the band plate member to allow the coolant to flow through the internal flow path of the band plate member constituted by combining the first component and the second component.

2. The coolant flow path-attached conductive member according to claim 1, wherein one of the first component and the second component is a groove component that extends along the internal flow path, and the other of the first component and the second component is a cover component that constitutes the internal flow path by covering a groove opening of the groove component.

3. The coolant flow path-attached conductive member according to claim 1, wherein the one end side of the first component is a component-side connection piece that extends beyond the second component to be connected to the component terminal, the other end side of the first component is a target-side connection piece that extends beyond the second component to be connected to the electrical connection target.

4. The coolant flow path-attached conductive member according to claim 1, wherein one of the pair of coolant ports are a flow path opening that is open, in an extension direction of the internal flow path, at a position of the band plate member that is adjacent to the one end side the first component, and the other of the pair of coolant ports are a tube shape protrusion that is vertically provided, on one of front and back surfaces of the band plate member, at a position of the band plate member that is adjacent to the other end side the first component to be in communication with the internal flow path.

5. The coolant flow path-attached conductive member according to claim 1, wherein the electric/electronic component is provided with a pair of component terminals, a pair of first components are provided to be connected to the pair of component terminals, respectively, in one-to-one correspondence, a pair of second components are provided to be combined with the pair of first components, respectively, in one-to-one correspondence, to constitute a pair of band plate members, and the coolant flow path-attached conductive member further comprises a flat connection pipe that is a pipe connecting a pair of internal flow paths by connecting one of the coolant ports of one of the pair of band plate members and one of the coolant ports of the other of the pair of band plate members, the flat connection pipe having a flat shape in which a pipe thickness size is shorter than a pipe width size and being made of an insulating material.

6. The coolant flow path-attached conductive member according to claim 5, wherein the coolant is a conductive fluid, and an insulating treatment for electrically insulating the coolant and the first component is applied to a surface portion constituting an inner surface of the internal flow path of at least the first component from among the first component and the second component constituting each of the pair of band plate members.

7. The coolant flow path-attached conductive member according to claim 5, wherein one of front and back surfaces of the flat connection pipe is arranged to be in a surface contact with an external surface of the electric/electronic component connected to the pair of first components.

8. The coolant flow path-attached conductive member according to claim 7, wherein the one of front and back surfaces of the flat connection pipe is in a surface contact with the external surface of the electric/electronic component via a predetermined heat transfer material.

9. The coolant flow path-attached conductive member according to claim 7, wherein the electric/electronic component is in a shape of a rectangular block, and the pair of component terminals are arranged in a terminal arrangement direction along one side edge on a terminal surface, which is a rectangular external surface of six surfaces of the rectangular block, the one end side of each of the pair of first components is connected to a corresponding one of the pair of component terminals so as to extend along the terminal arrangement direction, the one of front and back surfaces of the flat connection pipe is in a surface contact with an adjacent external surface, of the of six surfaces, adjacent to the terminal surface in a continuous manner across the one side edge, each of the pair of coolant ports connected by the flat connection pipe bends and extends, at a position adjacent to the one end side of the first component, in an orthogonal direction orthogonal to the front and back surfaces of the band plate member, and is open as an extension portion of the internal flow path, thereby being a bent flow path opening that positions the connected flat connection pipe at a surface contact position for the adjacent external surface.

10. The coolant flow path-attached conductive member according to claim 1, wherein the electric/electronic component is provided with a pair of component terminals, a pair of first components are provided to be connected to the pair of component terminals, respectively, in one-to-one correspondence, a pair of second components are provided to serve as an outer wall portion constituting an outer wall of an apparatus housing made of an insulating material, a flow path groove constituting a portion of the internal flow path is formed on one of front and back surfaces of the outer wall portion, the pair of second components are combined in one-to-one manner with the pair of first components in one-to-one correspondence to constitute the band plate members, one of the pair of coolant ports is a through hole that penetrates the outer wall portion and is provided at a position adjacent to a connection end portion of the first component for the component terminal, in the flow path groove of the outer wall portion serving as the second component, on the other of front and back surfaces of the outer wall portion, a through hole connection groove is formed to connect the through hole that is the one of the pair of coolant ports of one of the pair of band plate members and the through hole that is the one of the pair of coolant ports of the other of the pair of band plate members, and the coolant flow path-attached conductive member further comprises, on the other of front and back surfaces of the outer wall portion, a groove cover provided to close a groove opening of the through hole connection groove to form a connection flow path that connects the pair of internal flow paths.

11. The coolant flow path-attached conductive member according to claim 10, wherein an access opening is provided between a pair of outer wall portions serving as the pair of second components to allow for performing a task of connecting the connection end portions of the pair of first components and the component terminals from the other surface side, a pair of through holes are provided at a pair of adjacent positions to an inner peripheral edge of the access opening, and the through hole connection groove is formed so as to extend, on one of the pair of through holes, to branch into two along the inner peripheral edge of the access opening, and merge at the other of the of the pair of through holes.

12. The coolant flow path-attached conductive member according to claim 1, wherein the band plate member is fastened and fixed to the component terminal with a screw, a first screw through hole to be penetrated by a screw for fastening is formed on the one end side of the first component, and a first flow path groove constituting a portion of the internal flow path is formed on one of the front and back surfaces of the first component so as to pass, on the one end side, between: the first screw through hole; and an end surface on the one end side and a pair of side surfaces extending along the length direction, such that the first flow path groove surrounds in a U shape the first screw through hole, and the second component is combined with the one of the front and back surfaces of the first component so as to be overlapped thereon to constitute the band plate member, the second component being formed with a second screw through hole that is in communication with the first screw through hole, a second flow path groove being formed on an opposing surface to the one of the front and back surfaces of the first component, the second flow path groove configured to be overlapped with the first flow path groove to form the internal flow path.

13. The coolant flow path-attached conductive member according to claim 12, wherein the coolant is a conductive fluid, the second component is made of a conductive metal, an insulating treatment for electrically insulating the coolant and the first component is applied to an inner surface of the first flow path groove of the first component, and an insulating treatment for electrically insulating the coolant and the second component is applied to an inner surface of the second flow path groove of the first component.

14. The coolant flow path-attached conductive member according to claim 12, wherein the internal flow path is open on each of the pair of band side surfaces of the band plate member, and extends from one of the pair of band side surfaces to the other of the pair of band side surfaces while bending in a U shape along the way, and the pair of coolant ports are nipple members attached to openings of the internal flow path on each of the pair of band side surfaces to connect a predetermined pipe and the internal flow path.

15. The coolant flow path-attached conductive member according to claim 12, wherein a plurality of electric/ electronic components is arranged straight in a width direction of the band plate members connected to the component terminals, and the coolant ports of one of the pair of band plate members corresponding to the pair of adjacent electric/electronic components and the coolant ports of the other of the pair of adjacent band plate members are arranged straight in the width direction, and are connected by a straight pipe extending in the width direction.

* * * * *